US012712040B2

(12) United States Patent
Hung et al.

(10) Patent No.: US 12,712,040 B2
(45) Date of Patent: Aug. 18, 2026

(54) MEMORY CIRCUIT WITH MULTIPLY-ACCUMULATE (MAC) CIRCUIT AND METHOD OF OPERATING THE SAME

(71) Applicant: TAIWAN SEMICONDUCTOR MANUFACTURING COMPANY, LTD., Hsinchu (TW)

(72) Inventors: Je-Ming Hung, Hsinchu (TW); Haruki Mori, Hsinchu (TW); Hidehiro Fujiwara, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 17 days.

(21) Appl. No.: 18/676,801

(22) Filed: May 29, 2024

(65) Prior Publication Data

US 2025/0201322 A1 Jun. 19, 2025

Related U.S. Application Data

(60) Provisional application No. 63/612,212, filed on Dec. 19, 2023.

(51) Int. Cl.

| | |
|---|---|
| ***G11C 7/10*** | (2006.01) |
| ***G06F 7/50*** | (2006.01) |
| ***G06F 7/523*** | (2006.01) |
| ***G11C 27/00*** | (2006.01) |

(52) U.S. Cl.

CPC ................ *G11C 27/00* (2013.01); *G06F 7/50* (2013.01); *G06F 7/523* (2013.01)

(58) Field of Classification Search

CPC ........................................................ G11C 7/10

See application file for complete search history.

(56) References Cited

U.S. PATENT DOCUMENTS

| | | | | |
|---|---|---|---|---|
| 2022/0244916 | A1* | 8/2022 | Lee | G06F 7/5443 |
| 2022/0334801 | A1 | 10/2022 | Wang et al. | |
| 2023/0068645 | A1 | 3/2023 | Fujiwara et al. | |
| 2023/0267979 | A1* | 8/2023 | Fujiwara | G11C 7/106 365/233.1 |

FOREIGN PATENT DOCUMENTS

| | | |
|---|---|---|
| TW | 202305623 | 2/2023 |
| TW | I815392 | 9/2023 |

* cited by examiner

*Primary Examiner* — Hoai V Ho

(74) *Attorney, Agent, or Firm* — Hauptman Ham, LLP

(57) ABSTRACT

A memory circuit includes a memory cell array configured to store a set of stored data, a multiply-accumulate (MAC) circuit and an input output (IO) circuit. The set of stored data is a first set of weight signals or a set of inverted weight signals. The MAC circuit is configured to generate a first set of data in response to a second set of data and the set of stored data. The IO circuit includes a first circuit and a second circuit. The first circuit is configured to send the first set of weight signals in response to a set of enable signals, or generate the set of inverted weight signals in response to a set of inverted enable signals. The second circuit is configured to output a first set of output signals in response to the first set of data and the set of enable signals.

20 Claims, 18 Drawing Sheets

CLK
ADDR
$XIN_0$
$XIN_1$
$XIN_M$
ACT_XIN
$INV\_EN_0$
$MAC_tmp_0$
$D_OUT_0$
$INV\_EN_N$
$MAC_tmp_N$
$D_OUT_N$

A1
A2
7
15
6
11
1
11
7
9
7
6

$T_0$ $T_1$ $T_2$ $T_3$ $T_4$ $T_5$

MEMORY CIRCUIT WITH MULTIPLY-ACCUMULATE (MAC) CIRCUIT AND METHOD OF OPERATING THE SAME

PRIORITY CLAIM

This application claims the benefit of U.S. Provisional Application No. 63/612,212, filed Dec. 19, 2023, which is herein incorporated by reference in its entirety.

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
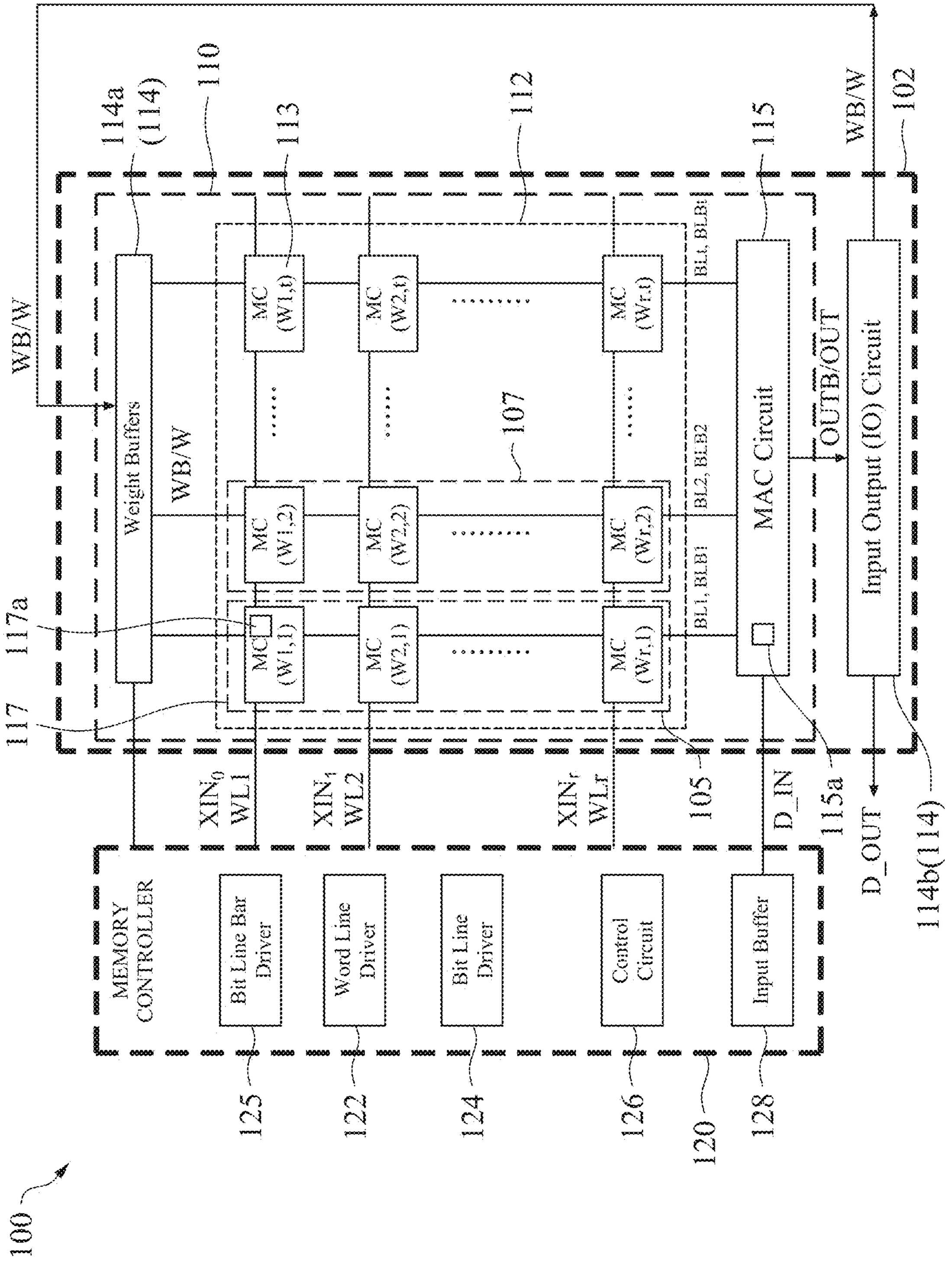
FIG. 1 is a block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a memory cell array configured to store a set of stored data.

In some embodiments, the set of stored data is one of a first set of weight signals or a set of inverted weight signals. In some embodiments, the set of inverted weight signals is inverted from the first set of weight signals. In some embodiments, the set of inverted weight signals is generated from the first set of weight signals.

In some embodiments, the memory cell array includes memory cells that store a logic 0 or a logic 1. In some embodiments, memory cells in the memory cell array that store a corresponding logic 1 consume more energy than corresponding memory cells in the memory cell array that store a logic 0. In some embodiments, the memory cell array is configured to store less logic 1s than logic 0s, thereby causing the memory cell array to consume less energy than other approaches.

In some embodiments, the memory circuit further includes a multiply-accumulate (MAC) circuit coupled to the memory cell array. In some embodiments, the MAC circuit is configured to generate a first set of data in response to a second set of data and the set of stored data.

In some embodiments, the memory circuit further includes an input/output (IO) circuit coupled to the MAC circuit.

In some embodiments, the IO circuit includes a first circuit coupled to the memory cell array. In some embodiments, the first circuit is configured to send the first set of weight signals in response to at least a set of enable signals, or to generate the set of inverted weight signals in response to at least a set of inverted enable signals.

In some embodiments, the IO circuit further includes a second circuit coupled to the MAC circuit. In some embodiments, the second circuit is configured to output a first set of output signals in response to at least the first set of data and the set of enable signals.

In some embodiments, the memory circuit is part of a computing-in-memory (CIM) macro configured to perform CIM operations usable in neural network applications, as well as other applications. In some embodiments, by configuring the memory circuit to store less logic 1s than logic 0s, the energy consumption of the CIM macro is reduced compared to other approaches.

FIG. 1 is a block diagram of a memory device 100, in accordance with some embodiments. A memory device is a type of integrated circuit (IC) device. In at least one embodiment, a memory device is an individual IC device. In some embodiments, a memory device is included as a part of a larger IC device which comprises circuitry other than the memory device for other functionalities.

The memory device 100 comprises a memory circuit 102 and a memory controller 120.

The memory circuit 102 comprises a memory macro 110. The memory macro 110 comprises a memory array 112, one or more weight buffers 114*a*, a multiply-accumulate (MAC) circuit 115 and an input/output (IO) circuit 114*b*. The memory controller 120 comprises a word line driver 122, a bit line driver 124, a bit line bar driver 125, a control circuit 126, and an input buffer 128. In some embodiments, one or more elements of the memory controller 120 are included in the memory macro 110, and/or one or more elements (except the memory array 112) of the memory macro 110 are included in the memory controller 120. In some embodiments, one or more elements of the memory macro 110 are not included in the memory macro 110. In some embodiments, at least one of the one or more weight buffers 114*a* or the IO circuit 114*b* are not included in the memory macro 110.

A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have yet to have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information or the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, the memory macro 110 comprises memory cells MC, as described herein, that form circuitry configured to provide a computing-in-memory (CIM) function associated with the memory cells MC. In at least one embodiment, a memory macro configured to provide a CIM function is referred to as a CIM macro. The described macro configuration is an example. Other configurations are within the scopes of various embodiments. In some embodiments, the memory cells MC and the MAC circuit 115 are referred to as a "CIM macro."

The memory cells MC of the memory macro 110 are arranged in a plurality of columns and rows of the memory array 112. The memory controller 120 is electrically coupled to the memory cells MC and configured to control operations of the memory cells MC including, but not limited to, a read operation, a write operation, or the like.

The memory array 112 further comprises a plurality of word lines (also referred to as "address lines") WL1 to WLr extending along the rows, a plurality of bit lines (also referred to as "data lines") BL1 to BLt extending along the columns of the memory cells MC, and a plurality of bit line bars (also referred to as "data line bars") BLB1 to BLBt extending along the columns of the memory cells MC, where r and t are natural numbers. In some embodiments, the memory array 112 does not include the plurality of bit line bars BLB1 to BLBt, but further comprises a plurality of source lines SL1 to SLt (not shown) extending along the columns of the memory cells MC. Other variations of memory array 112 are within the scope of the present disclosure. Each of the memory cells MC is electrically coupled to the memory controller 120 by at least one of the word lines, at least one of the bit lines and at least one of the bit line bars. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. In some embodiments, bit lines and bit line bars are used for transmitting data read from or written to the memory cells MC indicated by corresponding word lines, or the like.

In some embodiments, read bit lines and/or read bit line bars are configured for transmitting data read from the memory cells MC indicated by corresponding word lines, and write bit lines and/or write bit line bars are configured for transmitting data to be written to the memory cells MC indicated by corresponding word lines, or the like.

The word lines are commonly referred to herein as WL, the bit lines are commonly referred to herein as BL, and the bit line bars are referred to herein as BLB. Various numbers of word lines, bit lines and/or bit line bars in the memory array 112 are within the scope of various embodiments. In some embodiments, the memory cells MC are non-volatile memory (NVM). Example memory types of the memory cells MC include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells MC include SRAM memory cells.

In the example configuration in FIG. 1, the memory cells MC are single-port memory cells. In some embodiments, a port of a memory cell is represented by a set of a word line WL and a bit line BL/bit line bar BLB (referred to herein as a WL/BL/BLB set) which are configured to provide access to the memory cell in a read operation (i.e., read access) and/or in a write operation (i.e., write access). A single-port memory cell has one WL/BL/BLB set which is configured for both read access and write access, but not at the same time. A multi-port memory cell has several WL/BL/BLB sets each of which is configured for read access only, or for write access only, or for both read access and write access.

Examples of single-port memory cells are described with respect to FIGS. 1, 2, 3, 4, 5A-5B, 6, 7A-7B, 8, 9, 10A-10B and 11A-11C. Other configurations or other number of ports for memory cells in memory array 112 are within the scope of the present disclosure. For example, in some embodiments, one or more single-port memory cells that are described with respect to FIGS. 1, 2, 3, 4, 5A-5B, 6, 7A-7B, 8, 9, 10A-10B and 11A-11C can be replaced with a corresponding multi-port memory cell.

The memory array 112 comprises a plurality of memory segments. In some embodiments, a memory segment comprises a memory row, a memory column, a memory bank, or the like. A memory row comprises a plurality of memory cells coupled to the same word line WL. A memory column (also referred to as "memory string") comprises a plurality of memory cells coupled to the same bit line BL and the same bit line bar BLB. A memory bank comprises more than one memory row and/or more than one memory column. In at least one embodiment, a memory bank comprises a section of the memory array 112 with multiple memory rows and multiple memory columns. In some embodiments, a memory segment comprises multiple memory banks. In an example, a first memory segment 105 includes a memory column of memory cells MC coupled to the bit line BL1 and bit line bar BLB1, a second memory segment 107 includes a memory column of memory cells MC coupled to the bit line BL2 and bit line bar BLB2, or the like. Other manners of dividing the memory array 112 into a plurality of memory segments are within the scopes of various embodiments.

In some embodiments, the memory array 112 includes memory cells that store a logic 0 or a logic 1. In some embodiments, memory cells in memory array 112 that store a corresponding logic 1 consume more energy than corresponding memory cells in memory array 112 that store a logic 0. In some embodiments, memory array 112 is configured to store less logic 1s than logic 0s, thereby causing memory array 112 to consume less energy than other approaches.

Each of the memory cells MC includes a storage portion 117*a* (shown only in memory cell 117 for case of illustration). Each of the memory cells MC is configured to store a piece of weight data W (also referred to as a "set of weight signals W") or inverted weight data WB (also referred to as a "set of inverted weight signals WB"). In some embodiments, the set of inverted weight signals WB is inverted from set of weight signals W. Each storage portion 117*a* corresponds to each computation portion 115*a*.

In one or more example embodiments described herein, the memory cells MC are single-bit memory cells, i.e., each memory cell is configured to store a bit of weight data W or inverted weight data WB. This is an example, and multi-bit memory cells, each of which is configured to store more than one bit of weight data W or inverted weight data WB, are within the scopes of various embodiments. In some embodiments, a single-bit memory cell is also referred to as a bitcell. For example, the memory cell 113 coupled to the word line WL1, the bit line BLt and the bit line bar BLBt is configured to store a piece W1,*t* of the weight data or inverted weight data WB. In some embodiments, a piece W1,*t* of the weight data in FIG. 1 also includes inverted weight data WB, and WB1,*t* is not shown in FIG. 1 for ease of illustration. A combination of multiple pieces of weight data W (or inverted weight data WB) stored in multiple memory cells constitutes a weight value to be used in a CIM operation by MAC circuit 115. For simplicity, a piece of weight data stored in a memory cell MC, multiple pieces of weight data stored in multiple memory cells MC, or all pieces of weight data stored in all memory cells MC of the memory array 112 are referred to herein as weight data W.

The MAC circuit 115 comprises MAC cells (shown only in a first column of MAC circuit 115 for case of illustration/coupled to a first memory segment 105 for ease of illustration). In some embodiments, each MAC cell of the MAC cells is a corresponding computation portion 115*a* of a plurality of computation portions 115*a*. In some embodiments, each computation portion 115*a* of the plurality of computation portions 115*a* is a corresponding MAC element.

Each of the memory cells MC includes a storage portion 117*a* (shown only in memory cell 117 for case of illustration) and a computation portion 115*a* (shown only in memory cell 117 for case of illustration). Each of the memory cells MC is configured to store a piece of weight data W, and is configured to perform a CIM operation on the piece of weight data W and a piece of received data D_IN. Each storage portion 117*a* corresponds to each computation portion 115*a*.

Each storage portion 117*a* of the memory cells MC is configured to store a piece of weight data W, and each computation portion 115*a* of the memory cells MC is configured to perform a CIM operation on the piece of weight data W and a piece of received data D_IN.

Each of the MAC cells of MAC circuit 115 includes a computation portion 115*a* (shown only in a first column of MAC circuit 115 for ease of illustration/coupled to a first memory segment 105 for case of illustration). Each of the MAC cells of MAC circuit 115 is configured to perform a CIM operation on one of the piece of weight data W or the piece of inverted weight data WB and a piece of received data D_IN. Each computation portion 115*a* of MAC circuit 115 is configured to perform a CIM operation on one of the piece of weight data W or the piece of inverted weight data WB and a piece of received data D_IN. Each computation portion 115*a* corresponds to each storage portion 117*a*.

In some embodiments, each computation portion 115*a* of MAC circuit 115 is coupled to each corresponding memory cell of memory cells MC by a corresponding bit line BL and bit line bar BLB, and is configured to receive one of weight data W or inverted weight data WB.

Figure 11A:
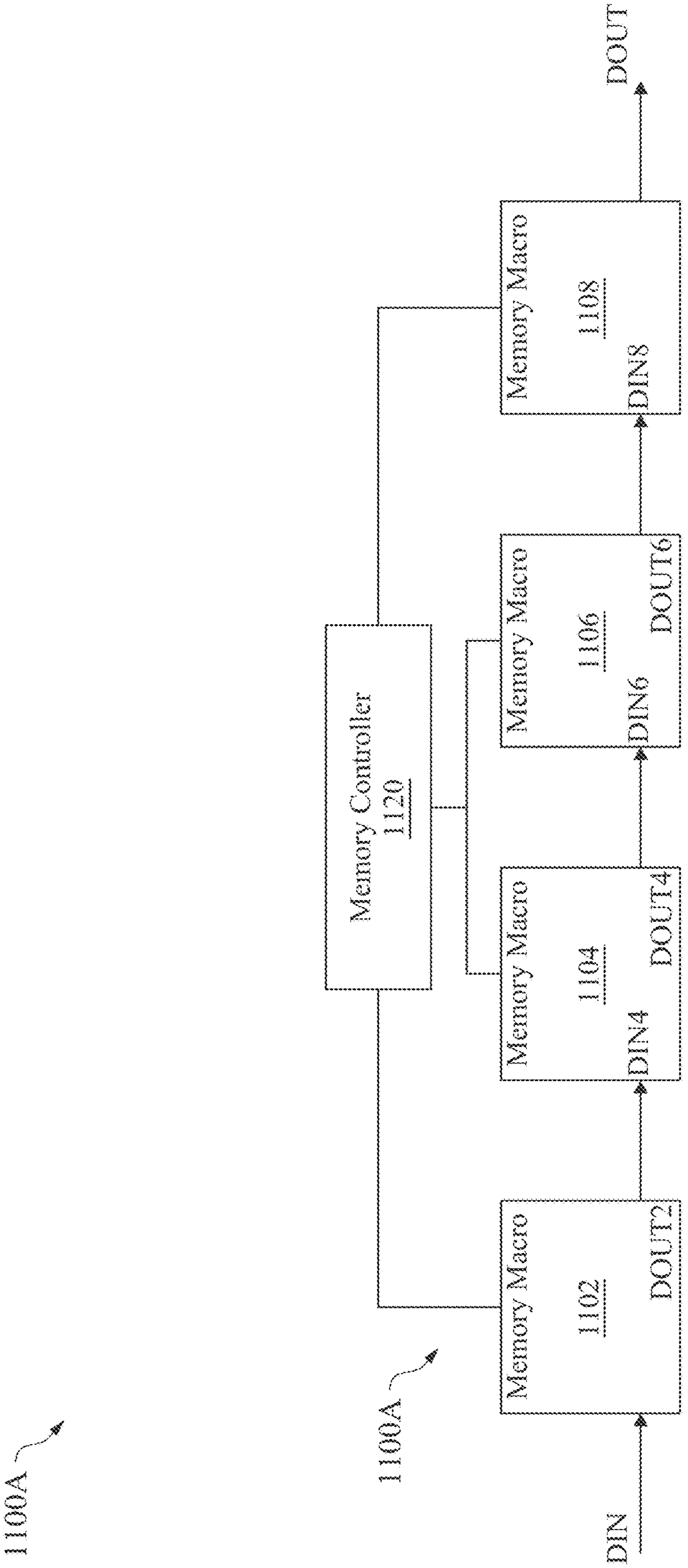
FIG. 11A is a schematic diagram of a memory device, in accordance with some embodiments.

Each computation portion 115*a* of MAC circuit 115 is further coupled to the outputs of the input buffer 128, and is configured to receive input data D_IN. In the example configuration in FIG. 1, the input data D_IN are supplied from the input buffer 128 in the memory controller 120. In one or more embodiments, the input data D_IN are output data (e.g., output data D_OUT) supplied from another memory macro (not shown) of the memory device 100 as shown in FIG. 11A. In some embodiments, the input data D_IN are serially supplied to the computation portion 115*a* in the form of a stream of bits, as described herein.

The computation portion 115*a* of MAC circuit 115 is configured to, based on the input data D_IN from the input buffer 128, generate output data OUT or OUTB corresponding to a CIM operation performed on the input data D_IN and one of the weight data W or inverted weight data WB read from one or more of the memory cells MC. Examples of CIM operations include, but are not limited to, mathematical operations, logical operations, combination thereof, or the like. In at least one embodiment, the computation portion 115*a* is a MAC circuit, and the CIM operation comprises a multiplication of one or more multibit weight values with one or more multibit input data values. Further computation portions or circuits configured to perform CIM operations other than a multiplication are within the scopes of various embodiments. The output data OUT or OUTB are supplied, as input data, to the IO circuit 114*b*.

In one or more example embodiments described herein, each computation portion 115*a* is configured to compute a corresponding bit of an output signal OUT or OUTB based on a CIM operation of one of the bit of weight data W or inverted weight data WB and a bit of received data D_IN. This is an example, and when the memory cells MC are multi-bit memory cells, each of which is configured to store more than one bit of weight data W or inverted weight data WB, then each computation portion 115*a* is configured to perform a corresponding CIM operation on the corresponding multi-bit pieces of weight data W or inverted weight data WB thereby generating corresponding bits of the output signal OUT or OUTB (also referred to as a "set of data signals OUT or OUTB" or a "set of data OUT or OUTB"), and are within the scopes of various embodiments.

The weight buffers 114*a* are configured to receive new weight data (e.g., weight data W) or new inverted weight data (e.g., inverted weight data WB). The weight buffers 114*a* are configured to second the new weight data (e.g., weight data W) or new inverted weight data (e.g., inverted weight data WB) to the corresponding memory cell in the memory array 112.

The weight buffers 114*a* are coupled to the memory array 112 and the IO circuit 114*b*, and configured to temporarily hold new weight data or new inverted weight data to be updated in the memory array 112. In some embodiments, the weight buffers 114*a* are located outside of memory macro 110. In some embodiments, the weight buffers 114*a* are part of IO circuit 114*b*. In some embodiments, the weight buffers 114*a* are not part of IO circuit 114*b*. In some embodiments as described herein, each memory segment is coupled to a corresponding weight buffer. In one or more embodiments as described herein, a common weight buffer is coupled to several memory segments. The weight buffers 114*a* are coupled to the memory cells MC in the memory array 112 via the bit lines BL and bit line bars BLB. In a weight data updating operation, the new weight data (weight data W or inverted weight data WB) are written into one or more memory cells MC from the weight buffers 114*a* and via the corresponding bit lines BL and corresponding bit line bars BLB. As schematically illustrated in FIG. 1, the weight buffers 114*a* are coupled to the memory controller 120 to receive the new weight data and/or control signals that specify when and/or in which memory cells MC the new weight data are to be updated. In at least one embodiment, the new weight data are received from external circuitry outside the memory device 100, for example, a processor as described herein. The new weight data are received through one or more input/output circuit (e.g., IO circuit 114*b*), and are forwarded to the weight buffers 114*a*. Example weight buffers include, but are not limited to, registers, memory cells, or other circuit elements configured for data storage.

The IO circuit 114*b* has inputs coupled to the bit lines BL/bit line bars BLB to receive the output data OUT/OUTB from one or more of the memory cells MC by the MAC circuit 115. In some embodiments, the IO circuit 114*b* is configured to receive the output data OUT/OUTB from the memory array 112 received from the bit lines BL/bit line bars BLB, and to generate the output signal D_OUT (also referred to as a "set of output signals D_OUT") on an output of the IO circuit 114*b*. Examples of the IO circuit 114*b* include registers, flip-flops, latches, or the like. In some embodiments, one or more non-limiting examples of the IO circuit 114*b* are shown in at least one of FIG. 4, 5A-5B, 6, 7A-7B, 8 or 9, and similar detailed description is therefore omitted.

In some embodiments, the output data D_OUT are supplied, as input data, to another memory macro (not shown) of the memory device 100 (as shown in FIG. 11A). In one or more embodiments, the output data D_OUT are output, through one or more I/O circuits (not shown) of the memory controller 120, to external circuitry outside the memory device 100, for example, a processor as described herein.

In the example configuration in FIG. 1, the controller 120 comprises the word line driver 122, the bit line driver 124, the bit line bar driver 125, the control circuit 126, and the input buffer 128. In at least one embodiment, the controller 120 further includes one or more clock generators for providing clock signals for various components of the memory device 100, one or more input/output (I/O) circuits for data exchange with external devices, and/or one or more controllers for controlling various operations in the memory device 100.

The word line driver 122 is coupled to the memory array 112 via the word lines WL. The word line driver 122 is configured to decode a row address of the memory cell MC selected to be accessed in a read operation or a write operation. The word line driver 122 is configured to supply a voltage to the selected word line WL corresponding to the decoded row address, and a different voltage to the other, unselected word lines WL. In some embodiments, each word line WL1, WL2, . . . , WLr of word lines WL has a corresponding input signal $Xin_0$, $Xin_1$, . . . , $Xin_r$ of the input signal Xin.

The bit line driver 124 is coupled to the memory array 112 via the bit lines BL. The bit line driver 124 is configured to decode a column address of the memory cell MC selected to be accessed in a read operation or a write operation. The bit line driver 124 is configured to supply a voltage to the selected bit line BL corresponding to the decoded column address, and a different voltage to the other, unselected bit lines BL.

The bit line bar driver 125 is coupled to the memory array 112 via the bit line bars BLB. The bit line bar driver 125 is configured to decode a column address of the memory cell MC selected to be accessed in a read operation or a write operation. The bit line bar driver 125 is configured to supply a voltage to the selected bit line bar BLB corresponding to the decoded column address, and a different voltage to the other, unselected bit line bars BLB.

The control circuit 126 is coupled to one or more of the memory cells MC, the weight buffers 114*a*, MAC circuit 115, IO circuit 114*b*, word line driver 122, bit line driver 124, bit line bar driver 125, input buffer 128 to coordinate operations of these circuits, drivers and/or buffers in the overall operation of the memory device 100. For example, the control circuit 126 is configured to generate various control signals for controlling operations of one or more of the memory cells MC, the weight buffers 114*a*, MAC circuit 115, IO circuit 114*b*, word line driver 122, bit line driver 124, bit line bar driver 125, input buffer 128.

The input buffer 128 is configured to receive the input data from external circuitry outside the memory device 100, for example, a processor as described herein. The input data are received through one or more I/O circuits (such as IO circuit 114*b*), and are forwarded by the input buffer 128 to the memory array 112. Example input buffers include, but are not limited to, registers, memory cells, or other circuit elements configured for data storage.

In at least one embodiment, CIM memory devices, such as the memory device 100, are advantageous over other approaches, where data are moved back and forth between the memory and a processor, because such back-and-forth data movement, which is a bottleneck to both performance and energy efficiency, is avoidable. Examples of CIM applications include, but are not limited to, artificial intelligence, image recognition, neural network for machine learning, or the like. In some embodiments, the memory device 100 makes it possible to simultaneously perform weight data updating and CIM operations, in one or more embodiments.

As a result, in at least one embodiment, it is possible to achieve one or more advantages including, but not limited to, reduced processing time, reduced power consumption, reduced chip area, lowered manufacturing cost, improved performance, or the like.

Other configurations or quantities of elements in memory device 100 are within the scope of the present disclosure.

Figure 2:
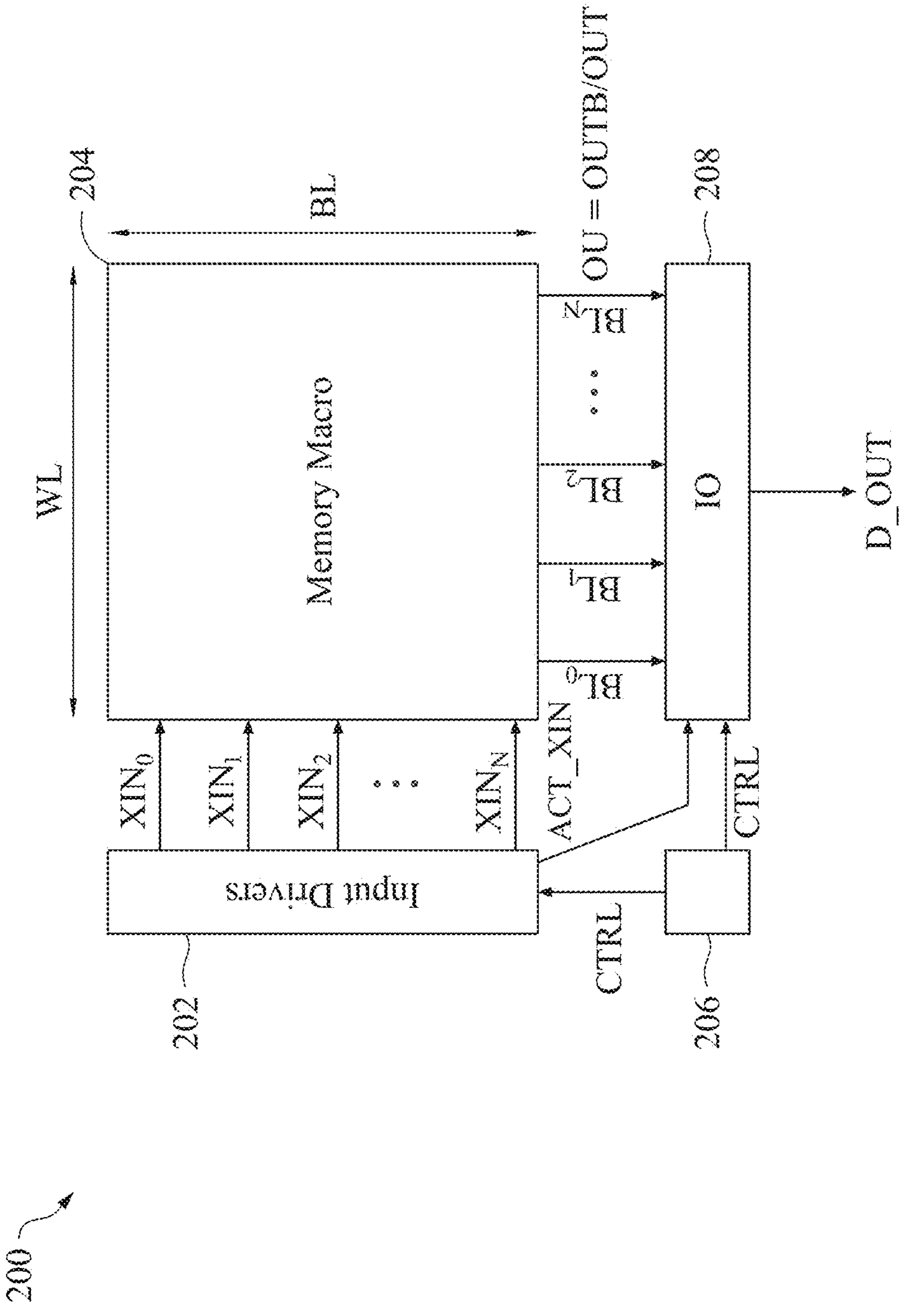
FIG. 2 is a circuit diagram of a memory circuit, in accordance with some embodiments.

FIG. 2 is a circuit diagram of a memory circuit 200, in accordance with some embodiments.

Memory circuit 200 is an embodiment of portions of memory device 100 of FIG. 1, and similar detailed description is therefore omitted.

Components that are the same or similar to those in one or more of FIGS. 1, 2, 3, 4, 5A-5B, 6, 7A-7B, 8, 9, 10A-10B and 11A-11C (shown below) are given the same reference numbers, and detailed description thereof is thus omitted. For ease of illustration, some of the labeled elements of FIGS. 1, 2, 3, 4, 5A-5B, 6, 7A-7B, 8, 9, 10A-10B and 11A-11C are not labelled in each of FIGS. 1, 2, 3, 4, 5A-5B, 6, 7A-7B, 8, 9, 10A-10B and 11A-11C. In some embodiments, FIGS. 1, 2, 3, 4, 5A-5B, 6, 7A-7B, 8, 9, 10A-10B and 11A-11C include additional elements not shown in FIGS. 1, 2, 3, 4, 5A-5B, 6, 7A-7B, 8, 9, 10A-10B and 11A-11C.s Memory circuit 200 includes a set of input drivers 202, a memory macro 204, a control circuit 206 and an IO circuit 208.

In some embodiments, the set of input drivers 202 is word line driver 122, controller 206 of FIG. 2 is memory controller 120 of FIG. 1, and IO circuit 208 of FIG. 2 is IO circuit 114*b* of FIG. 1, and similar detailed description is therefore omitted. In some embodiments, memory macro 204 of FIG. 2 is memory array 112 and MAC circuit 115 of FIG. 1, and similar detailed description is therefore omitted.

The set of input drivers 202 is coupled to memory macro 204 and controller 206. In some embodiments, the set of input drivers 202 is configured to generate the input signal Xin and to generate a count signal ACT_XIN. In some embodiments, the count signal ACT_XIN corresponds to a number of word lines WL in memory macro 204. In some embodiments, memory macro 204 is a CIM macro.

The memory macro 204 is coupled to the set of input drivers 202 and the IO circuit 208.

The controller 206 is coupled to the set of input drivers 202 and the IO circuit 208. In some embodiments, controller 206 includes one or more clock generators for providing a set of control signals CTRL, such as a clock signal, for the set of input drivers 202, and for the IO circuit 208, for data exchange with external devices, and/or one or more controllers for controlling various operations in memory circuit 200.

The IO circuit 208 is coupled to the set of input drivers 202 and the controller 206.

In some embodiments, the IO circuit 208 is configured to perform at least of read or write operations of memory macro 204. In some embodiments, the IO circuit 208 is configured to perform at least one of read or write operations of memory macro 204 in response to at least one of the count signal ACT_XIN, the set of control signals CTRL or the set of data signals OUT or OUTB. In some embodiments, the IO circuit 208 is configured to generate the set of output signals D_OUT in response to at least one of the count signal ACT_XIN, the set of control signals CTRL or a set of data signals OUT or OUTB.

Word line WL corresponds to one or more word lines WL1, WL2, . . . , WLr in FIG. 1, bit line BL corresponds to one or more bit lines BL1, BL2, . . . , BLt in FIG. 1, and bit line bar BLB corresponds to one or more bit line bars BLB1, BLB2, . . . , BLBt in FIG. 1, and similar detailed description is therefore omitted.

Other configurations or quantities of elements in memory circuit 200 are within the scope of the present disclosure.

Figure 3:
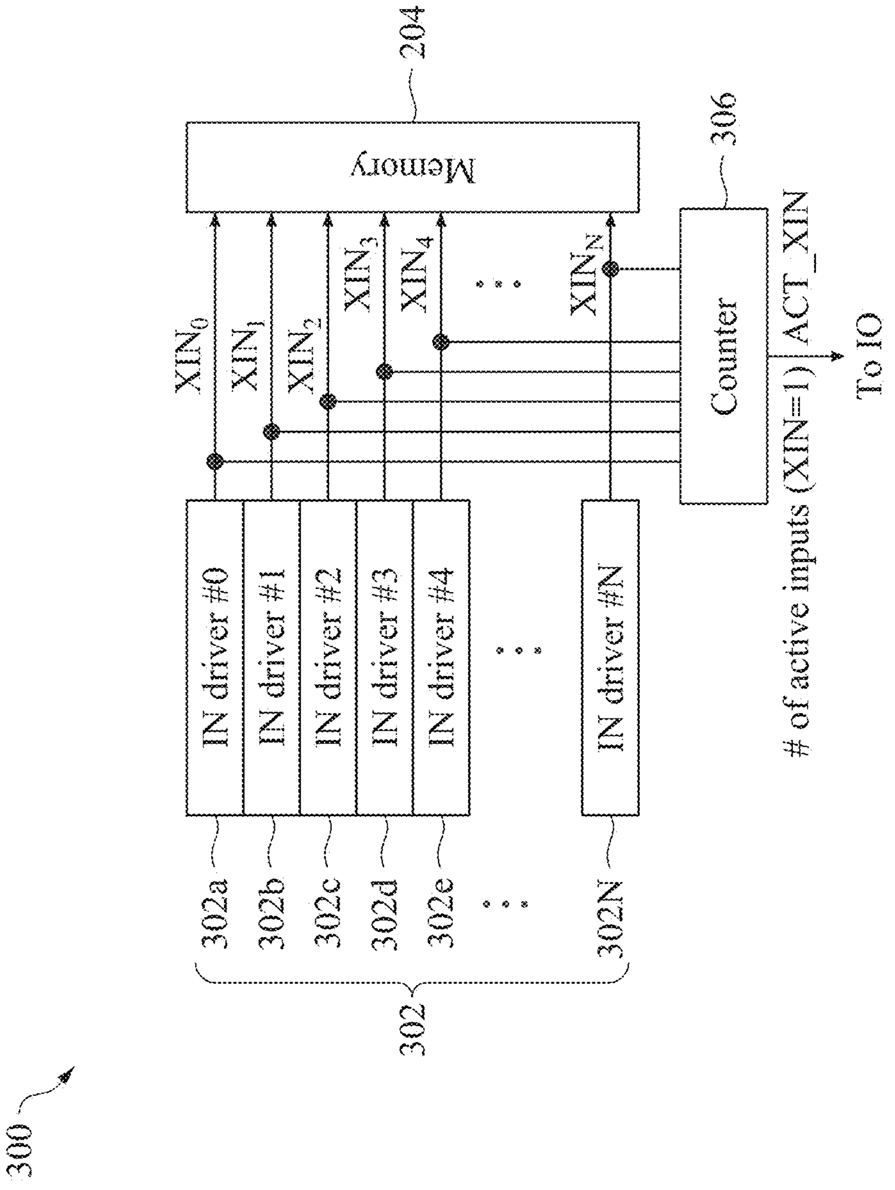
FIG. 3 is a circuit diagram of a memory circuit, in accordance with some embodiments.

FIG. 3 is a circuit diagram of a memory circuit 300, in accordance with some embodiments.

Memory circuit 300 is an embodiment of portions of memory device 100 of FIG. 1, and similar detailed description is therefore omitted. For example, a set of word line drivers 302 and a counter 304 are an embodiment of the set of input drivers 202 of FIG. 2, and similar detailed description is therefore omitted.

Memory circuit 300 includes the set of word line drivers 302, the counter 304 and memory macro 204.

The set of word line drivers 302 is coupled to memory macro 204 and the counter 304. In some embodiments, the set of word line drivers 302 is configured to generate a set of word line signals Xin. The set of word line drivers includes at least one of word line driver 302*a*, 302*b*, . . . , 302N, where N is an integer. In some embodiments, each word line driver 302*a*, 302*b*, . . . , 302N is configured to generate a corresponding word line signal $Xin_0$, $Xin_1$, . . . , $Xin_N$.

In some embodiments, the set of word line signals Xin includes one or more of word line signals $Xin_0$, $Xin_1$, . . . , $Xin_N$, where N is an integer. In some embodiments, the set of word line signals Xin includes N+1 word line signals. In some embodiments, each word line WL0, WL1, . . . , WLN of the set of word lines WL has a corresponding word line signal $Xin_0$, $Xin_1$, . . . , $Xin_N$ of the set of word line signals Xin.

In some embodiments, each word line driver 302*a*, 302*b*, . . . , 302N of the set of word line drivers 302 is configured to output a corresponding word line signal $Xin_0$, $Xin_1$, . . . , $Xin_N$ of the set of word line signals Xin on a corresponding word line WL0, WL1, . . . , WLN of the set of word lines WL.

In some embodiments, the counter 306 is coupled to the set of word line drivers 302. In some embodiments, the counter 306 is configured to receive the set of word line signals Xin on the set of word lines WL. In some embodiments, the counter 306 is configured to count a number of active inputs (e.g., active word lines WL) that receive active word line signals Xin from the set of word line drivers 302, and thereby generates the count signal ACT_XIN. Stated differently, in some embodiments, the counter 306 is configured to generate the count signal ACT_XIN by counting the number of active inputs (e.g., active word lines WL) that receive active word line signals Xin from the set of word line drivers 302. In some embodiments, an active input is an input that has a word line signal equal to a logically high (e.g., logic 1). In some embodiments, an active input is an input that has a word line signal equal to a logically low (e.g., logic 0).

In some embodiments, the counter 306 is configured to generate the count signal ACT_XIN by counting the number of active word line signals Xin received from the set of word line drivers 302. In some embodiments, an active word line signal of the number of active word line signals Xin is a word line signal equal to a logically high (e.g., logic 1). In some embodiments, an active word line signal of the number of active word line signals Xin is a word line signal equal to a logically low (e.g., logic 0).

In some embodiments, the counter is further configured to send the count signal ACT_XIN to the IO circuit 208. In some embodiments, the count signal ACT_XIN is a number of active word line signals in the set of word line signal Xin. Stated differently, in some embodiments, the count signal ACT_XIN is a number of active word lines in the set of word lines WL. For example, in some embodiments, if the number of word lines WL is 8, and the number of word line signals Xin that have a logic 1 are 7, then the number of active word line signals Xin is 7, and the counter 306 is configured to count the 7 active word line signals Xin, and thus counter 306 generates the count signal ACT_XIN as being 7.

In some embodiments, the count signal ACT_XIN is generated for each corresponding column of memory cells in memory macro 204. In some embodiments, the count signal ACT_XIN includes one or more of count signals $ACT\_XIN_1$, $ACT\_XIN_2$, . . . , $ACT\_XIN_N$. In some embodiments, count signal $ACT\_XIN_1$, $ACT\_XIN_2$, . . . , $ACT\_XIN_N$ is a corresponding count signal of the corresponding column of memory cells in memory macro 204.

In some embodiments, the count signal ACT_XIN is usable by at least one of circuit 400, 800 or 900.

Other configurations or quantities of elements in memory circuit 300 are within the scope of the present disclosure.

Figure 4:
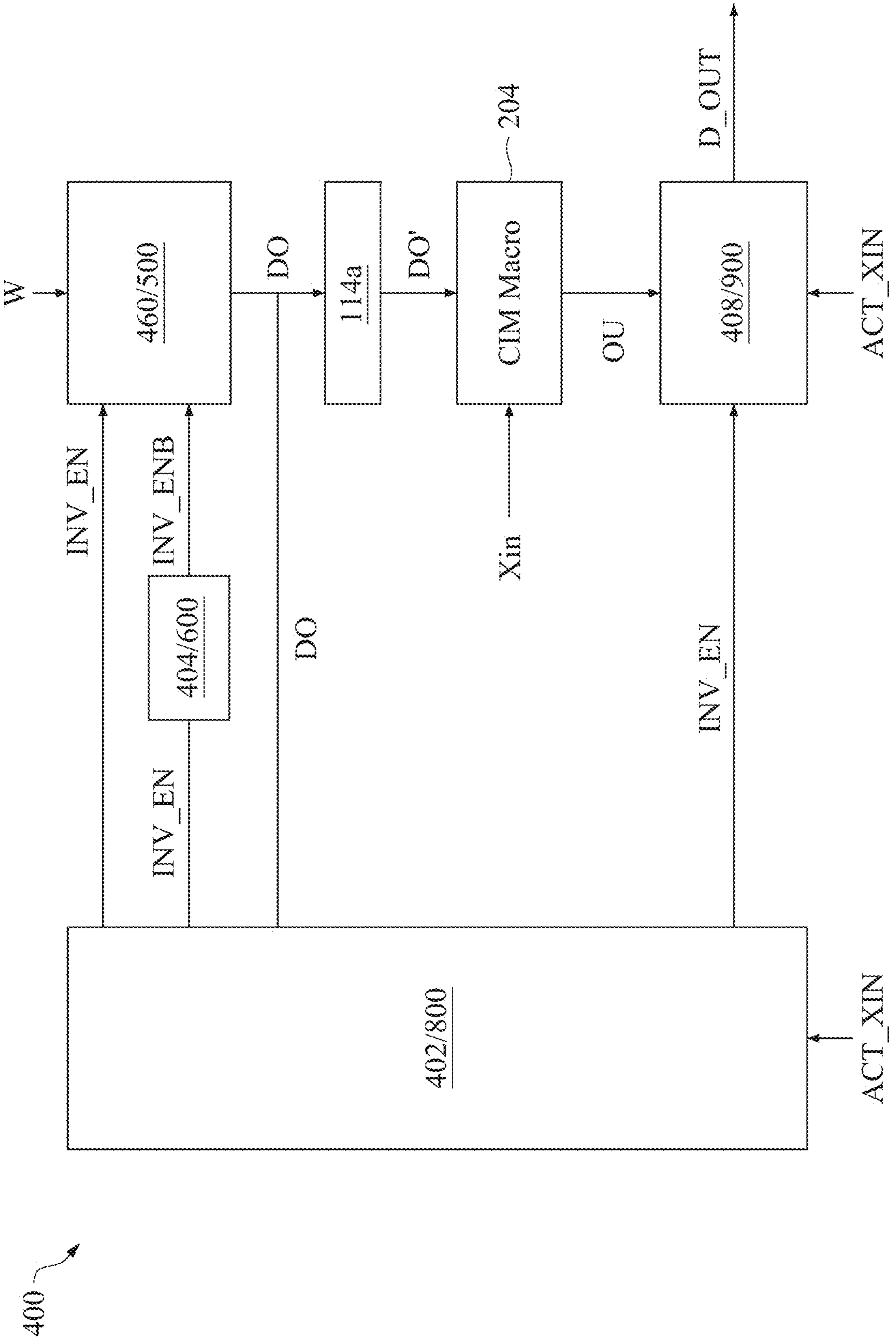
FIG. 4 is a block diagram of a memory circuit, in accordance with some embodiments.

FIG. 4 is a block diagram of a memory circuit 400, in accordance with some embodiments.

Memory circuit 400 comprises the weight buffer 114*a*, the memory macro 204, a write circuit 402, a circuit 404, a write circuit 406, and a read circuit 408.

In some embodiments, the write circuit 402, the circuit 404, the write circuit 406, and the read circuit 408 are an embodiment of the IO circuit 114*b*, and similar detailed description is therefore omitted.

The write circuit 402 is coupled to the circuit 404, the write circuit 406 and the read circuit 408.

An input of the write circuit 402 is coupled to an output of the write circuit 406. In some embodiments, the input of the write circuit 402 is coupled to an output of the counter 306.

An output of the write circuit 402 is coupled to an input of the circuit 404, an input of the write circuit 406 and an input of the read circuit 408.

The write circuit 402 is configured to receive at least the count signal ACT_XIN or a set of stored data DO. In some embodiments, the count signal ACT_XIN is received from counter 306 in FIG. 3. In some embodiments, the set of stored data DO is received from write circuit 406. In some embodiments, the set of stored data DO includes a set of weight signals W (discussed at least in FIG. 1) or a set of inverted weight signals WB (discussed at least in FIG. 1).

The write circuit 402 is configured to generate at least a set of enable signals INV_EN in response to at least the set of stored data DO or the count signal ACT_XIN. In some embodiments, the set of enable signals INV_EN includes one or more of enable signals $INV\_EN_0$, $INV\_EN_1$, . . . , $INV\_EN_N$, where N is an integer.

The write circuit 402 is configured to output at least the set of enable signals INV_EN to at least one of the circuit 404, the write circuit 406 or the read circuit 408.

The circuit 404 is coupled to the write circuit 402 and the write circuit 406.

An input of the circuit 404 is coupled to the output of the write circuit 402.

An output of the circuit 404 is coupled to the input of the write circuit 406.

The write circuit 402 is configured to receive at least the set of enable signals INV_EN.

The write circuit 402 is configured to generate at least a set of inverted enable signals INV_ENB in response to at least the set of enable signals INV_EN. In some embodiments, the set of inverted enable signals INV_ENB includes one or more of inverted enable signals $INV\_ENB_0$, $INV\_ENB_1$, . . . , $INV\_ENB_N$, where N is an integer.

In some embodiments, the set of inverted enable signals INV_ENB is inverted from the set of enable signals INV_EN. In some embodiments, at least inverted enable signal $INV\_ENB_0$, $INV\_ENB_1$, . . . , $INV\_ENB_N$ of the set of inverted enable signals INV_ENB is inverted from at least the corresponding enable signal $INV\_EN_0$, $INV\_EN_1$, . . . , $INV\_EN_N$ of the set of enable signals INV_EN.

The circuit 404 is configured to output at least the set of inverted enable signals INV_ENB to at least the write circuit 406.

The write circuit 406 is coupled to the write circuit 402, the circuit 404 and the weight buffer 114*a*.

An input of the write circuit 406 is coupled to the output of the write circuit 402, the output of the circuit 404 and a source of the set of weight signals W. In some embodiments, the set of weight signals W is sent or generated by a circuit outside of memory device 100 of FIG. 1. In some embodiments, the set of weight signals W is sent or generated by a circuit that is part of memory device 100 of FIG. 1. In some embodiments, the set of weight signals W is sent or generated by a circuit outside of the IO circuit 114*b* of FIG. 1. In some embodiments, the set of weight signals W is sent or generated by a circuit that is part of the IO circuit 114*b* of FIG. 1.

An output of the write circuit 406 is coupled to the input of the write circuit 402 and an input of the weight buffer 114*a*.

The write circuit 406 is configured to receive at least the set of weight signals W, the set of enable signals INV_EN or the set of inverted enable signals INV_ENB. In some embodiments, the set of enable signals INV_EN is received from the write circuit 402. In some embodiments, the set of inverted enable signals INV_ENB is received from the circuit 404.

The write circuit 406 is configured to generate at least the set of stored data DO in response to at least the set of weight signals W, the set of enable signals INV_EN or the set of inverted enable signals INV_ENB. In some embodiments, the write circuit 406 is configured to output at least the set of stored data DO in response to at least the set of weight signals W, the set of enable signals INV_EN or the set of inverted enable signals INV_ENB.

In some embodiments, the set of stored data DO includes the set of weight signals W (discussed at least in FIG. 1) or the set of inverted weight signals WB (discussed at least in FIG. 1).

In some embodiments, the set of weight signals W includes one or more of weight signal $W_0$, $W_1$, . . . , $W_N$.

In some embodiments, the set of inverted weight signals WB includes one or more of a corresponding inverted weight signal $WB_0$, $WB_1$, . . . , $WB_N$.

In some embodiments, the set of inverted weight signals WB is generated by the write circuit 406 in response to at least the set of weight signals W, the set of enable signals INV_EN or the set of inverted enable signals INV_ENB. In some embodiments, inverted weight signal $WB_0$, $WB_1$, . . . , $WB_N$ of the set of inverted weight signals WB is generated from a corresponding weight signal $W_0$, $W_1$, . . . , $W_N$ of the set of weight signals W in response to at least a corresponding enable signal $INV\_EN_0$, $INV\_EN_1$, . . . , $INV\_EN_N$ of the set of enable signals INV_EN or a corresponding inverted enable signal $INV\_ENB_0$, $INV\_ENB_1$, . . . , $INV\_ENB_N$ of the set of inverted enable signals INV_ENB.

In some embodiments, inverted weight signal $WB_0$, $WB_1$, . . . , $WB_N$ of the set of inverted weight signals WB is inverted from a corresponding weight signal $W_0$, $W_1$, . . . , $W_N$ of the set of weight signals W.

In some embodiments, the set of stored data DO includes one or more of stored data signals $DO_0$, $DO_1$, . . . , $DO_N$, where N is an integer.

In some embodiments, the set of stored data DO is equal to one or more members of the set of weight signals W or the set of inverted weight signals WB.

In some embodiments, the stored data signal $DO_0$, $DO_1$, . . . , $DO_N$, is equal to a corresponding weight signal $W_0$, $W_1$, . . . , $W_N$ or a corresponding inverted weight signal $WB_0$, $WB_1$, . . . , $WB_N$ based on a corresponding enable signal $INV\_EN_0$, $INV\_EN_1$, . . . , $INV\_EN_N$ or a corresponding inverted enable signal $INV\_ENB_0$, $INV\_ENB_1$, . . . , $INV\_ENB_N$.

In some embodiments, a stored data signal $DO_0$, $DO_1$, . . . , $DO_N$ of the set of stored data DO is equal to a corresponding weight signal $W_0$, $W_1$, . . . , $W_N$ of the set of weight signals W when the corresponding enable signal $INV\_EN_0$, $INV\_EN_1$, . . . , $INV\_EN_N$ of the set of enable signals INV_EN is equal to a logically low (e.g., logic 0). In some embodiments, a stored data signal $DO_0$, $DO_1$, . . . , $DO_N$ of the set of stored data DO is equal to a corresponding weight signal $W_0$, $W_1$, . . . , $W_N$ of the set of weight signals W when the corresponding inverted enable signal $INV\_ENB_0$, $INV\_ENB_1$, . . . , $INV\_ENB_N$ of the set of inverted enable signals INV_ENB is equal to a logically high (e.g., logic 1).

In some embodiments, a stored data signal $DO_0$, $DO_1$, . . . , $DO_N$ of the set of stored data DO is equal to a corresponding inverted weight signal $WB_0$, $WB_1$, . . . , $WB_N$ of the set of inverted weight signals WB when the corresponding enable signal $INV\_EN_0$, $INV\_EN_1$, . . . , $INV\_EN_N$ of the set of enable signals INV_EN is equal to a logically high (e.g., logic 1). In some embodiments, a stored data signal $DO_0$, $DO_1$, . . . , $DO_N$ of the set of stored data DO is equal to a corresponding inverted weight signal $WB_0$, $WB_1$, . . . , $WB_N$ of the set of inverted weight signals WB when the corresponding inverted enable signal $INV\_ENB_0$, $INV\_ENB_1$, . . . , $INV\_ENB_N$ of the set of inverted enable signals INV_ENB is equal to a logically low (e.g., logic 0).

In some embodiments, a stored data signal $DO_0$, $DO_1$, . . . , $DO_N$ of the set of stored data DO is equal to a corresponding inverted weight signal $WB_0$, $WB_1$, . . . , $WB_N$ of the set of inverted weight signals WB when the corresponding enable signal $INV\_EN_0$, $INV\_EN_1$, . . . , $INV\_EN_N$ of the set of enable signals INV_EN is equal to a logically low (e.g., logic 0). In some embodiments, a stored data signal $DO_0$, $DO_1$, . . . , $DO_N$ of the set of stored data DO is equal to a corresponding inverted weight signal $WB_0$, $WB_1$, . . . , $WB_N$ of the set of inverted weight signals WB when the corresponding inverted enable signal $INV\_ENB_0$, $INV\_ENB_1$, . . . , $INV\_ENB_N$ of the set of inverted enable signals INV_ENB is equal to a logically high (e.g., logic 1).

In some embodiments, a stored data signal $DO_0$, $DO_1$, . . . , $DO_N$ of the set of stored data DO is equal to a corresponding weight signal $W_0$, $W_1$, . . . , $W_N$ of the set of weight signals W when the corresponding enable signal $INV\_EN_0$, $INV\_EN_1$, . . . , $INV\_EN_N$ of the set of enable signals INV_EN is equal to a logically high (e.g., logic 1). In some embodiments, a stored data signal $DO_0$, $DO_1$, . . . , $DO_N$ of the set of stored data DO is equal to a corresponding weight signal $W_0$, $W_1$, . . . , $W_N$ of the set of weight signals WB when the corresponding inverted enable signal $INV\_ENB_0$, $INV\_ENB_1$, . . . , $INV\_ENB_N$ of the set of inverted enable signals INV_ENB is equal to a logically low (e.g., logic 0).

The write circuit 406 is configured to output at least the set of stored data DO to at least one of the write circuit 402 or the weight buffer 114*a*.

The weight buffer 114*a* is coupled to the write circuit 406 and the memory macro 204.

An input of the weight buffer 114*a* is coupled to the output of the write circuit 406.

An output of the weight buffer 114*a* is coupled to the input of the memory macro 204. In some embodiments, the output of the weight buffer 114*a* is further coupled to the input of the write circuit 402, and the weight buffer 114*a* is further configured to output a set of stored data DO' to the write circuit 402. In these embodiments, the input of the write circuit 402 is not coupled to the output of the write circuit 406.

The weight buffer 114*a* is configured to receive at least the set of stored data DO.

The weight buffer 114*a* is configured to generate at least a set of stored data DO' in response to at least the set of stored data DO. In some embodiments, the set of stored data DO' is equal to the set of stored data DO. In some embodiments, the set of stored data DO' is a delayed version of the set of stored data DO.

In some embodiments, the set of stored data DO' includes one or more of stored data signals $DO_0'$, $DO_1'$, . . . , $DO_N'$, where N is an integer. In some embodiments, a stored data signal $DO_0'$, $DO_1'$, . . . , $DO_N'$ is equal to a corresponding stored data signal $DO_0$, $DO_1$, . . . , $DO_N$. In some embodiments, a stored data signal $DO_0'$, $DO_1'$, . . . , $DO_N'$ is a delayed version of a corresponding stored data signal $DO_0$, $DO_1$, . . . , $DO_N$.

The weight buffer 114*a* is configured to output at least the set of stored data DO' to at least the memory macro 204.

The memory macro 204 is coupled to the weight buffer 114*a* and the read circuit 408.

An input of the memory macro 204 is coupled to the output of the weight buffer 114*a*. In some embodiments, the input of the memory macro 204 is coupled to the output of the weight buffer 114*a* and to an output of the set of input drivers 202 of FIG. 2.

An output of the memory macro 204 is coupled to the input of the read circuit 408.

The memory macro 204 is configured to receive and store at least the set of stored data DO.

In some embodiments, during a read operation of the memory macro 204, the memory macro 204 is configured to output at least a set of output signals OU in response to at least the set of stored data DO' or the set of input signals Xin.

In some embodiments, the set of output signals OU includes one or more of output signals $OU_0$, $OU_1$, . . . , $OU_N$, where N is an integer.

In some embodiments, the set of output signals OU includes a set of output signals OUT (discussed at least in FIG. 1) or a set of output signals OUTB (discussed at least in FIG. 1).

In some embodiments, the set of output signals OUT includes one or more of output signals $OUT_0$, $OUT_1$, . . . , $OUT_N$, where N is an integer. In some embodiments, the set of output signals OUT correspond to when the set of stored data DO includes the set of weight signals W.

In some embodiments, the set of output signals OUTB includes one or more of output signals $OUTB_0$, $OUTB_1$, . . . , $OUTB_N$, where N is an integer. In some embodiments, the set of output signals OUTB correspond to when the set of stored data DO includes the set of inverted weight signals WB.

In some embodiments, the set of output signals OU is equal to one or more members of the set of output signals OUT or the set of output signals OUTB. In some embodiments, output signal $OU_0$, $OU_1$, . . . , $OU_N$ is equal to a corresponding output signal $OUT_0$, $OUT_1$, . . . , $OUT_N$ or a corresponding output signal $OUTB_0$, $OUTB_1$, . . . , $OUTB_N$.

The memory macro 204 is configured to output at least the set of output signals OU to at least the read circuit 408. In some embodiments, the memory macro 204 is configured to output at least the set of output signals OUT or OUTB to at least the read circuit 408.

The read circuit 408 is coupled to the write circuit 402 and the memory macro 204.

An input of the read circuit 408 is coupled to the output of the write circuit 402, memory macro 204 and the output of the counter 306.

In some embodiments, an output of the read circuit 408 is coupled to other circuits (not shown).

The read circuit 408 is configured to receive at least the set of enable signals INV_EN, the set of output signals OU or the count signal ACT_XIN. In some embodiments, the read circuit 408 is configured to receive at least the set of enable signals INV_EN, the count signal ACT_XIN, and one of the set of output signals OUT or the set of output signals OUTB.

In some embodiments, the set of enable signals INV_EN is received from the write circuit 402. In some embodiments, the count signal ACT_XIN is received from the counter 306. In some embodiments, during a read operation of memory macro 204, the set of output signals OU is read from the memory macro 204 in response to at least one of the set of enable signals INV_EN or the count signal ACT_XIN.

The read circuit 408 is configured to output at least the set of output signals D_OUT in response to at least the set of enable signals INV_EN, the set of output signals OU or the count signal ACT_XIN. In some embodiments, the read circuit 408 is configured to generate at least the set of output signals D_OUT in response to at least the set of enable signals INV_EN, the set of output signals OU or the count signal ACT_XIN.

In some embodiments, the set of output signals D_OUT includes one or more of output signals $D_OUT_0$, $D\_OUT_1$, . . . , $D_OUT_N$, where N is an integer.

The read circuit 408 is configured to output at least the set of output signals D_OUT.

Other configurations or quantities of elements in memory circuit 400 are within the scope of the present disclosure.

Figure 5A:
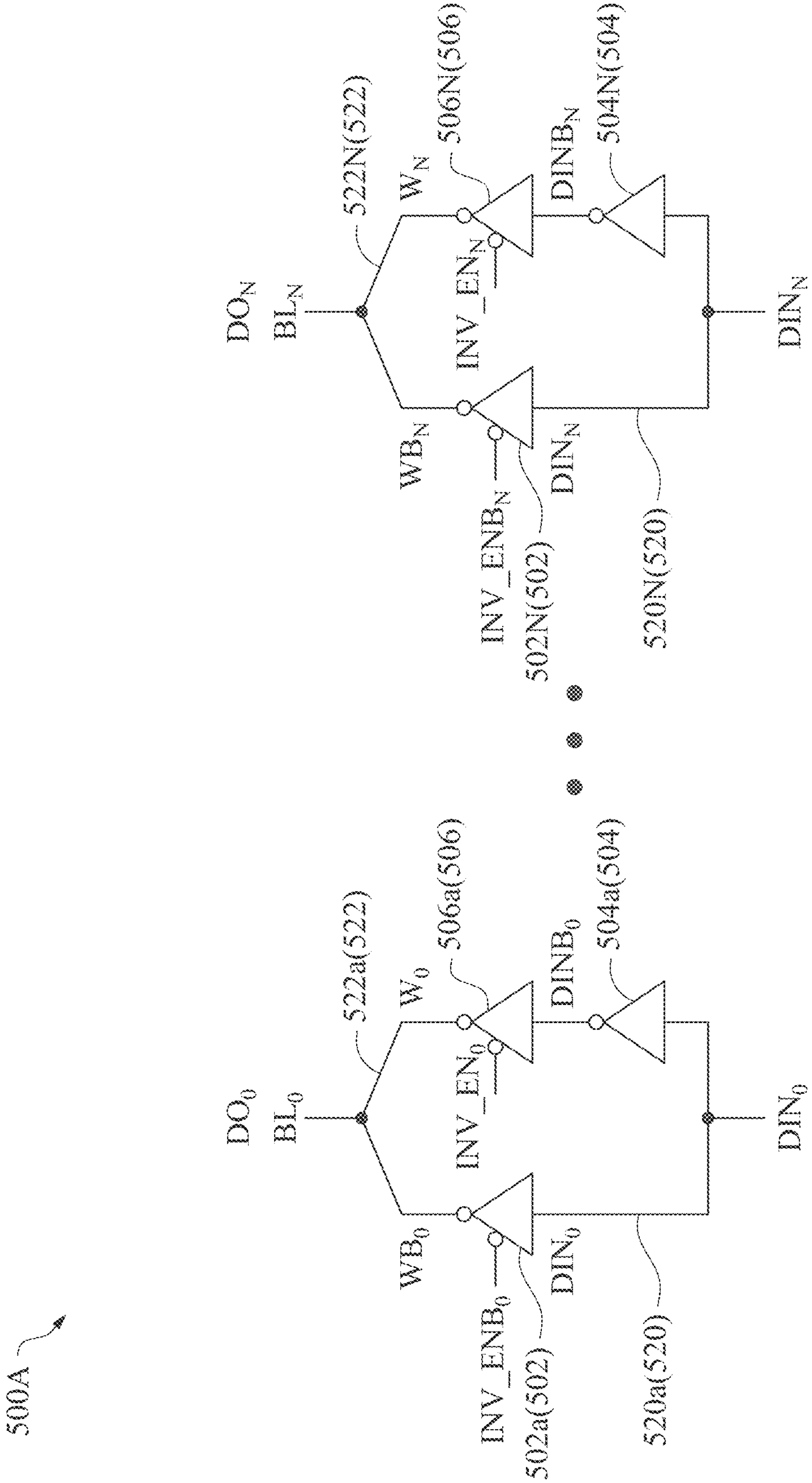
FIGS. 5A-5B are a corresponding circuit diagram of a corresponding write circuit, in accordance with some embodiments.
Figure 5B:
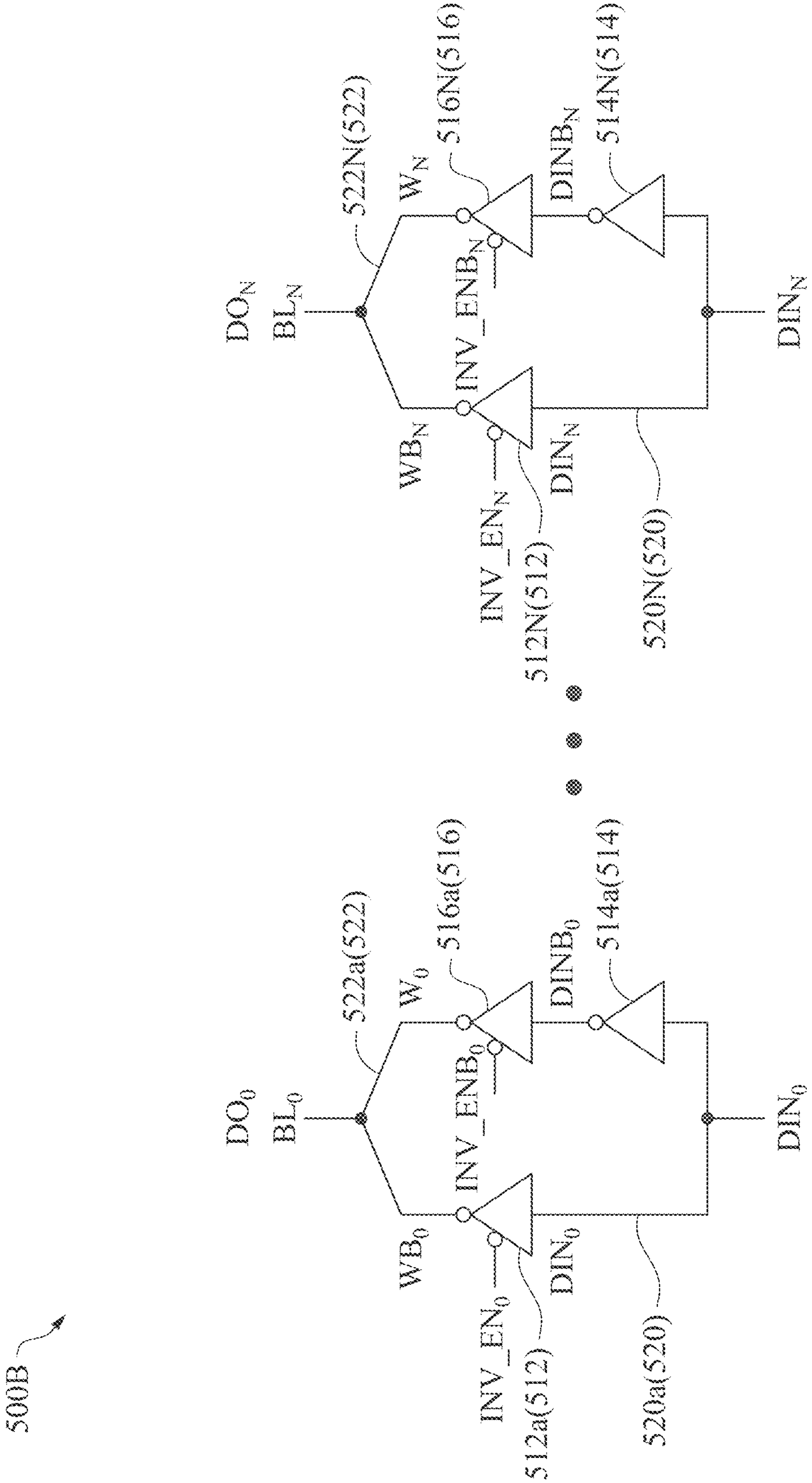

FIGS. 5A-5B are a corresponding circuit diagram of a corresponding write circuit 500A-500B, in accordance with some embodiments.

Write circuit 500A is an embodiment of write circuit 406 of FIG. 4, and similar detailed description is therefore omitted.

Write circuit 500A is configured to generate at least the set of stored data DO in response to at least the set of weight signals DIN, the set of enable signals INV_EN or the set of inverted enable signals INV_ENB. In some embodiments, the set of weight signals DIN is equal to the set of weight signals W.

In some embodiments, the set of stored data DO is usable by at least one of weight buffer 114*a*, memory circuit 400, write circuit 402 or write circuit 800.

In some embodiments, the set of weight signals W is usable by at least one of weight buffer 114*a*, memory circuit 400, write circuit 402 or write circuit 800.

In some embodiments, the set of inverted weight signals WB is usable by at least one of weight buffer 114*a*, memory circuit 400, write circuit 402 or write circuit 800.

In some embodiments, write circuit 500A is configured to generate at least the set of stored data DO in response to at least the set of weight signals W, the set of enable signals INV_EN or the set of inverted enable signals INV_ENB.

Write circuit 500A includes a set of paths 520 and a set of paths 522.

In some embodiments, the set of paths 520 comprises one or more of paths 520*a*, 520*b*, . . . , 520N.

In some embodiments, the set of paths 522 comprises one or more of paths 522*a*, 522*b*, . . . , 522N.

In some embodiments, a path in the set of paths 520 and a path in the set of paths 522 is selected/deselected based on the set of inverted enable signals INV_ENB or the set of enable signals INV_EN. In some embodiments, the selected path in the set of paths 520 or the set of paths 522 is configured to generate the corresponding set of inverted weight signals WB or the corresponding set of weight signals W as the set of stored data signals DO.

In some embodiments, a path in the set of paths 520 is selected by a corresponding inverted enable signal of the set of inverted enable signals INV_ENB. Similarly, in some embodiments, a path in the set of paths 520 is deselected by a corresponding inverted enable signal of the set of inverted enable signals INV_ENB.

In some embodiments, a path in the set of paths 522 is selected by a corresponding enable signal of the set of enable signals INV_EN. Similarly, in some embodiments, a path in the set of paths 522 is deselected by a corresponding enable signal of the set of enable signals INV_EN.

In some embodiments, each path of the set of paths 520 and each corresponding path in the set of paths 522 are coupled together.

Each path of the set of paths 520 is configured to receive a corresponding weight signal of the set of weight signals DIN and a corresponding inverted enable signal of the set of inverted enable signals INV_ENB.

Each path of the set of paths 520 is configured to generate a corresponding inverted weight signal of the set of inverted weight signals WB in response to being selected. In some embodiments, an unselected path in the set of paths 520 does not output or generate the corresponding inverted weight signal of the set of inverted weight signals WB.

Each path of the set of paths 520 is selected based on a corresponding inverted enable signal $INV\_ENB_0$, $INV\_ENB_1$, . . . , $INV\_ENB_N$ of the set of inverted enable signals INV_ENB.

In some embodiments, the set of paths 520 further comprises a set of inverters 502.

In some embodiments, the set of inverters 502 comprises one or more of inverters 502*a*, 502*b*, . . . , 502N.

Each path of the set of paths 520 comprises a corresponding inverter 502*a*, 502*b*, . . . , 502N of the set of inverters 502.

In some embodiments, when selected, inverter 502*a*, 502*b*, . . . , 502N of the set of inverters 502 is configured to generate a corresponding inverted weight signal $WB_0$, $WB_1$, . . . $WB_N$ of the set of inverted weight signals WB in response to a corresponding weight signal $DIN_0$, $DIN_1$, . . . $DIN_N$ of the set of weight signals DIN and a corresponding inverted enable signal $INV\_ENB_0$, $INV\_ENB_1$, . . . , $INV\_ENB_N$ of the set of inverted enable signals INV_ENB.

For brevity, path 520*a* will be described, but the remaining paths in the set of paths 520 are similar to path 520*a*. For brevity, inverter 502*a* will be described, but the remaining inverters in the set of inverters 502 are similar to inverter 502*a*.

In some embodiments, inverter 502*a* is enabled or selected by a logically low signal (logic 0). In some embodiments, inverter 502*a* is enabled or selected when the inverted enable signal $INV\_ENB_0$ of the set of inverted enable signals INV_ENB is a logically low signal (logic 0).

In some embodiments, inverter 502*a* is coupled to the circuit 404 and the weight buffer circuit 114*a*. In some embodiments, inverter 502*a* is a tri-state inverter. In some embodiments, inverter 502*a* is selected or deselected in response to the inverted enable signal $INV\_ENB_0$ of the set of inverted enable signals INV_ENB. In some embodiments, when inverter 502*a* is selected, inverter 502*a* is configured to generate an inverted output signal (e.g., weight signal $WB_0$). In some embodiments, when inverter 502*a* is deselected, inverter 502*a* is configured to have a high impedance state on the output terminal. In some embodiments, when inverter 502*a* is deselected, weight signal $WB_0$ is a logic 0.

In some embodiments, inverter 502*a* is configured to receive a corresponding weight signal DIN0 of the set of weight signals DIN and a corresponding inverted enable signal $INV\_ENB_0$ of the set of inverted enable signals INV_ENB. In some embodiments, inverter 502*a* is selected by a corresponding inverted enable signal $INV\_ENB_0$ of the set of inverted enable signals INV_ENB.

In some embodiments, when selected, inverter 502*a* is configured to generate a corresponding inverted weight signal $WB_0$ of the set of inverted weight signals $WB_0$ in response to a corresponding weight signal $DIN_0$ of the set of weight signals DIN. In some embodiments, when inverter 502*a* is selected, the corresponding data signal $DO_0$ of the set of stored data signals DO is equal to a corresponding inverted weight signal $WB_0$ of the set of inverted weight signals $WB_0$.

In some embodiments, when deselected, inverter 502*a* is not configured to generate a corresponding inverted weight signal $WB_0$ of the set of inverted weight signals $WB_0$ in response to a corresponding weight signal $DIN_0$ of the set of weight signals DIN. In some embodiments, when inverter 502*a* is deselected, the corresponding data signal $DO_0$ of the set of stored data signals DO is equal to a corresponding weight signal $W_0$ of the set of weight signals $W_0$ that is generated by inverter 506*a*.

Each path of the set of paths 522 is configured to receive a corresponding weight signal of the set of weight signals DIN and a corresponding enable signal of the set of enable signals INV_EN.

Each path of the set of paths 522 is configured to generate a corresponding weight signal of the set of weight signals W in response to being selected. In some embodiments, an unselected path in the set of paths 522 does not output or generate the corresponding weight signal of the set of weight signals W.

Each path of the set of paths 522 is selected based on a corresponding enable signal $INV\_EN_0$, $INV\_EN_1$, . . . , $INV\_EN_N$ of the set of enable signals INV_EN.

In some embodiments, the set of paths 522 further comprises a set of inverters 504 and a set of inverters 506.

In some embodiments, the set of inverters 504 comprises one or more of inverters 504*a*, 504*b*, . . . , 504N. In some embodiments, the set of inverters 506 comprises one or more of inverters 506*a*, 506*b*, . . . , 506N.

Each path of the set of paths 522 comprises a corresponding inverter 504*a*, 504*b*, . . . , 504N of the set of inverters 504 and a corresponding inverter 506*a*, 506*b*, . . . , 506N of the set of inverters 506.

Inverter 504*a*, 504*b*, . . . , 504N of the set of inverters 504 is configured to generate a corresponding inverted weight signal $DINB_0$, $DINB_1$, . . . $DINB_N$ of the set of inverted weight signals DINB in response to a corresponding weight signal $DIN_0$, $DIN_1$, . . . $DIN_N$ of the set of weight signals DIN.

In some embodiments, when selected, inverter 506*a*, 506*b*, . . . , 506N of the set of inverters 506 is configured to generate a corresponding weight signal $W_0$, $W_1$, . . . $W_N$ of the set of weight signals W in response to a corresponding inverted weight signal $DINB_0$, $DINB_1$, . . . $DINB_N$ of the set of inverted weight signals DINB and a corresponding enable signal $INV\_EN_0$, $INV\_EN_1$, . . . , $INV\_EN_N$ of the set of enable signals INV_EN.

In some embodiments, the order of inverter 506*a*, 506*b*, . . . , 506N of the set of inverters 506 and the order of corresponding inverter 504*a*, 504*b*, . . . , 504N of the set of inverters 504 is changed. For example, in some embodiments, an output of corresponding inverter 506*a*, 506*b*, . . . , 506N of the set of inverters 506 is coupled to a corresponding input of corresponding inverter 504*a*, 504*b*, . . . , 504N of the set of inverters 504.

For brevity, path 522*a* will be described, but the remaining paths in the set of paths 522 are similar to path 522*a*. For brevity, inverters 504*a* and 506*a* will be described, but the remaining inverters in the set of inverters 504 and 506 are similar to inverters 504*a* and 506*a*.

In some embodiments, inverter 506*a* is enabled or selected by a logically low signal (logic 0). In some embodiments, inverter 506*a* is enabled or selected when the enable signal $INV\_EN_0$ of the set of enable signals INV_EN is a logically low signal (logic 0).

In some embodiments, inverter 504*a* is coupled between circuit 404 and inverter 506*a*. In some embodiments, inverter 506*a* is coupled to inverter 504*a* and the weight buffer circuit 114*a*.

Inverter 504*a* is configured to receive weight signal $DIN_0$ of the set of weight signals DIN. Inverter 504*a* is configured to generate an inverted weight signal $DINB_0$ of the set of inverted weight signals DINB in response to a corresponding weight signal $DIN_0$ of the set of weight signals DIN. An output of inverter 504*a* is coupled to an input of inverter 506*a*.

In some embodiments, inverter 506*a* is a tri-state inverter. In some embodiments, inverter 506*a* is selected or deselected in response to the enable signal $INV\_EN_0$ of the set of enable signals INV_EN. In some embodiments, when inverter 506*a* is selected, inverter 506*a* is configured to generate an output signal (e.g., weight signal $W_0$). In some embodiments, when inverter 506*a* is deselected, inverter 506*a* is configured to have a high impedance state on the output terminal. In some embodiments, when inverter 506*a* is deselected, weight signal $W_0$ is a logic 0.

In some embodiments, inverter 506*a* is configured to receive a corresponding inverted weight signal $DINB_0$ of the set of weight signals DIN and a corresponding enable signal $INV\_EN_0$ of the set of enable signals INV_EN. In some embodiments, inverter 506_a_ is selected by a corresponding enable signal $INV\_EN_0$ of the set of enable signals INV_EN.

In some embodiments, when selected, inverter 506_a_ is configured to generate a corresponding weight signal $W_0$ of the set of weight signals $W_0$ in response to a corresponding inverted weight signal $DINB_0$ of the set of inverted weight signals DINB. In some embodiments, when inverter 506_a_ is selected, the corresponding data signal $DO_0$ of the set of stored data signals DO is equal to a corresponding weight signal $W_0$ of the set of weight signals $W_0$.

In some embodiments, when deselected, inverter 506_a_ is not configured to generate a corresponding weight signal $W_0$ of the set of weight signals $W_0$ in response to a corresponding inverted weight signal $DINB_0$ of the set of inverted weight signals DINB. In some embodiments, when inverter 506_a_ is deselected, the corresponding data signal $DO_0$ of the set of stored data signals DO is equal to a corresponding inverted weight signal $WB_0$ of the set of inverted weight signals $WB_0$ that is generated by inverter 502_a_.

Other configurations or quantities of elements in write circuit 500A are within the scope of the present disclosure.

FIG. 5B is a corresponding circuit diagram of a corresponding write circuit 500B, in accordance with some embodiments.

Write circuit 500B is an embodiment of write circuit 406 of FIG. 4, and similar detailed description is therefore omitted.

Write circuit 500B is a variation of write circuit 500A of FIG. 5A, and similar detailed description is therefore omitted. In comparison with write circuit 500A of FIG. 5A, the set of inverters 512 of FIG. 5B replaces the set of inverters 502 of FIG. 5A, the set of inverters 514 of FIG. 5B replaces the set of inverters 504 of FIG. 5A, and the set of inverters 516 of FIG. 5B replaces the set of inverters 506 of FIG. 5A, and similar detailed description is therefore omitted.

In comparison with write circuit 500A of FIG. 5A, the set of enable signals INV_EN of FIG. 5B replaces the set of inverted enable signals INV_ENB of FIG. 5A, and the set of inverted enable signals INV_ENB of FIG. 5B replaces the set of enable signals INV_EN of FIG. 5A, and similar detailed description is therefore omitted.

Write circuit 500B includes the set of paths 520 and the set of paths 522.

In some embodiments, in FIG. 5B, a path in the set of paths 520 is selected by a corresponding enable signal of the set of enable signals INV_EN. Similarly, in some embodiments, in FIG. 5B, a path in the set of paths 520 is deselected by a corresponding enable signal of the set of enable signals INV_EN.

In some embodiments, in FIG. 5B, a path in the set of paths 522 is selected by a corresponding inverted enable signal of the set of inverted enable signals INV_ENB. Similarly, in some embodiments, in FIG. 5B, a path in the set of paths 522 is deselected by a corresponding inverted enable signal of the set of inverted enable signals INV_ENB.

In FIG. 5B, each path of the set of paths 520 is selected based on a corresponding enable signal $INV\_EN_0$, $INV\_EN_1$, . . . , $INV\_EN_N$ of the set of enable signals INV_EN.

In some embodiments, the set of paths 520 further comprises a set of inverters 512.

In some embodiments, the set of inverters 512 comprises one or more of inverters 512_a_, 512_b_, . . . , 512N. In some embodiments, inverters 512_a_, 512_b_, . . . , 512N of the set of inverters 512 is similar to corresponding inverters 502_a_, 502_b_, . . . , 502N of the set of inverters 502.

In FIG. 5B, each path of the set of paths 520 comprises a corresponding inverter 512_a_, 512_b_, . . . , 512N of the set of inverters 512.

In some embodiments, when selected, inverter 512_a_, 512_b_, . . . , 512N of the set of inverters 512 is configured to generate a corresponding inverted weight signal $WB_0$, $WB_1$, . . . $WB_N$ of the set of inverted weight signals WB in response to a corresponding weight signal $DIN_0$, $DIN_1$, $DIN_N$ of the set of weight signals DIN and a corresponding enable signal $INV\_EN_0$, $INV\_EN_1$, . . . , $INV\_EN_N$ of the set of enable signals INV_EN.

For brevity, path 520_a_ will be described, but the remaining paths in the set of paths 520 are similar to path 520_a_. For brevity, inverter 512_a_ will be described, but the remaining inverters in the set of inverters 512 are similar to inverter 512_a_.

In some embodiments, inverter 512_a_ is enabled or selected by a logically high signal (logic 1). In some embodiments, inverter 512_a_ is enabled or selected when the enable signal $INV\_EN_0$ of the set of enable signals INV_EN is a logically high signal (logic 1).

In some embodiments, inverter 512_a_ is coupled to the circuit 404 and the weight buffer circuit 114_a_. In some embodiments, inverter 512_a_ is a tri-state inverter. In some embodiments, inverter 512_a_ is selected or deselected in response to the enable signal $INV\_EN_0$ of the set of enable signals INV_EN. In some embodiments, when inverter 512_a_ is selected, inverter 512_a_ is configured to generate an inverted output signal (e.g., weight signal $WB_0$). In some embodiments, when inverter 512_a_ is deselected, inverter 512_a_ is configured to have a high impedance state on the output terminal. In some embodiments, when inverter 512_a_ is deselected, weight signal $WB_0$ is a logic 0.

In some embodiments, inverter 512_a_ is configured to receive a corresponding weight signal DIN0 of the set of weight signals DIN and a corresponding enable signal $INV\_EN_0$ of the set of enable signals INV_EN. In some embodiments, inverter 512_a_ is selected by a corresponding enable signal $INV\_EN_0$ of the set of enable signals INV_EN.

In some embodiments, when selected, inverter 512_a_ is configured to generate a corresponding inverted weight signal $WB_0$ of the set of inverted weight signals $WB_0$ in response to a corresponding weight signal $DIN_0$ of the set of weight signals DIN. In some embodiments, when inverter 512_a_ is selected, the corresponding data signal $DO_0$ of the set of stored data signals DO is equal to a corresponding inverted weight signal $WB_0$ of the set of inverted weight signals $WB_0$.

In some embodiments, when deselected, inverter 512_a_ is not configured to generate a corresponding inverted weight signal $WB_0$ of the set of inverted weight signals $WB_0$ in response to a corresponding weight signal $DIN_0$ of the set of weight signals DIN. In some embodiments, when inverter 512_a_ is deselected, the corresponding data signal $DO_0$ of the set of stored data signals DO is equal to a corresponding weight signal $W_0$ of the set of weight signals $W_0$ that is generated by inverter 516_a_.

In FIG. 5B, each path of the set of paths 522 is configured to receive a corresponding weight signal of the set of weight signals DIN and a corresponding inverted enable signal of the set of inverted enable signals INV_ENB.

In FIG. 5B, each path of the set of paths 522 is configured to generate a corresponding weight signal of the set of weight signals W in response to being selected. In some embodiments, an unselected path in the set of paths 522 does not output or generate the corresponding weight signal of the set of weight signals W.

In FIG. 5B, each path of the set of paths 522 is selected based on a corresponding inverted enable signal $INV\_ENB_0$, $INV\_ENB_1$, . . . , $INV\_ENB_N$ of the set of inverted enable signals INV_ENB.

In some embodiments, the set of paths 522 further comprises a set of inverters 514 and a set of inverters 516.

In some embodiments, the set of inverters 514 comprises one or more of inverters 514*a*, 514*b*, . . . , 514N. In some embodiments, inverters 514*a*, 514*b*, . . . , 514N of the set of inverters 514 is similar to corresponding inverters 504*a*, 504*b*, . . . , 504N of the set of inverters 504.

In some embodiments, the set of inverters 516 comprises one or more of inverters 516*a*, 516*b*, . . . , 516N. In some embodiments, inverters 516*a*, 516*b*, . . . , 516N of the set of inverters 516 is similar to corresponding inverters 506*a*, 506*b*, . . . , 506N of the set of inverters 506.

In FIG. 5B, each path of the set of paths 522 comprises a corresponding inverter 514*a*, 514*b*, . . . , 514N of the set of inverters 514 and a corresponding inverter 516*a*, 516*b*, . . . , 516N of the set of inverters 516.

Inverter 514*a*, 514*b*, . . . , 514N of the set of inverters 514 is configured to generate a corresponding inverted weight signal $DINB_0$, $DINB_1$, . . . $DINB_N$ of the set of inverted weight signals DINB in response to a corresponding weight signal $DIN_0$, $DIN_1$, . . . $DIN_N$ of the set of weight signals DIN.

In some embodiments, when selected, inverter 516*a*, 516*b*, . . . , 516N of the set of inverters 516 is configured to generate a corresponding weight signal $W_0$, $W_1$, . . . $W_N$ of the set of weight signals W in response to a corresponding inverted weight signal $DINB_0$, $DINB_1$, . . . $DINB_N$ of the set of inverted weight signals DINB and a corresponding inverted enable signal $INV\_ENB_0$, $INV\_ENB_1$, . . . , $INV\_ENB_N$ of the set of inverted enable signals INV_ENB.

In some embodiments, the order of inverter 516*a*, 516*b*, . . . , 516N of the set of inverters 516 and the order of corresponding inverter 514*a*, 514*b*, . . . , 514N of the set of inverters 514 is changed. For example, in some embodiments, an output of corresponding inverter 516*a*, 516*b*, . . . , 516N of the set of inverters 516 is coupled to a corresponding input of corresponding inverter 514*a*, 514*b*, . . . , 514N of the set of inverters 514.

For brevity, path 522*a* will be described, but the remaining paths in the set of paths 522 are similar to path 522*a*. For brevity, inverters 514*a* and 516*a* will be described, but the remaining inverters in the set of inverters 514 and 516 are similar to inverters 514*a* and 516*a*.

In some embodiments, inverter 516*a* is enabled or selected by a logically high signal (logic 1). In some embodiments, inverter 516*a* is enabled or selected when the inverted enable signal $INV\_ENB_0$ of the set of inverted enable signals INV_ENB is a logically high signal (logic 1).

In some embodiments, inverter 514*a* is coupled between circuit 404 and inverter 516*a*. In some embodiments, inverter 516*a* is coupled to inverter 514*a* and the weight buffer circuit 114*a*.

Inverter 514*a* is configured to receive weight signal $DIN_0$ of the set of weight signals DIN. Inverter 514*a* is configured to generate an inverted weight signal $DINB_0$ of the set of inverted weight signals DINB in response to a corresponding weight signal $DIN_0$ of the set of weight signals DIN. An output of inverter 514*a* is coupled to an input of inverter 516*a*.

In some embodiments, inverter 516*a* is a tri-state inverter. In some embodiments, inverter 516*a* is selected or deselected in response to the inverted enable signal $INV\_ENB_0$ of the set of inverted enable signals INV_ENB. In some embodiments, when inverter 516*a* is selected, inverter 516*a* is configured to generate an output signal (e.g., weight signal $W_0$). In some embodiments, when inverter 516*a* is deselected, inverter 516*a* is configured to have a high impedance state on the output terminal. In some embodiments, when inverter 516*a* is deselected, weight signal $W_0$ is a logic 0.

In some embodiments, inverter 516*a* is configured to receive a corresponding inverted weight signal $DINB_0$ of the set of weight signals DIN and a corresponding inverted enable signal $INV\_ENB_0$ of the set of inverted enable signals INV_ENB. In some embodiments, inverter 516*a* is selected by a corresponding inverted enable signal $INV\_ENB_0$ of the set of inverted enable signals INV_ENB.

In some embodiments, when selected, inverter 516*a* is configured to generate a corresponding weight signal $W_0$ of the set of weight signals $W_0$ in response to a corresponding inverted weight signal $DINB_0$ of the set of inverted weight signals DINB. In some embodiments, when inverter 516*a* is selected, the corresponding data signal $DO_0$ of the set of stored data signals DO is equal to a corresponding weight signal $W_0$ of the set of weight signals $W_0$.

In some embodiments, when deselected, inverter 516*a* is not configured to generate a corresponding weight signal $W_0$ of the set of weight signals $W_0$ in response to a corresponding inverted weight signal $DINB_0$ of the set of inverted weight signals DINB. In some embodiments, when inverter 516*a* is deselected, the corresponding data signal $DO_0$ of the set of stored data signals DO is equal to a corresponding inverted weight signal $WB_0$ of the set of inverted weight signals $WB_0$ that is generated by inverter 512*a*.

Other configurations or quantities of elements in write circuit 500B are within the scope of the present disclosure.

Figure 6:
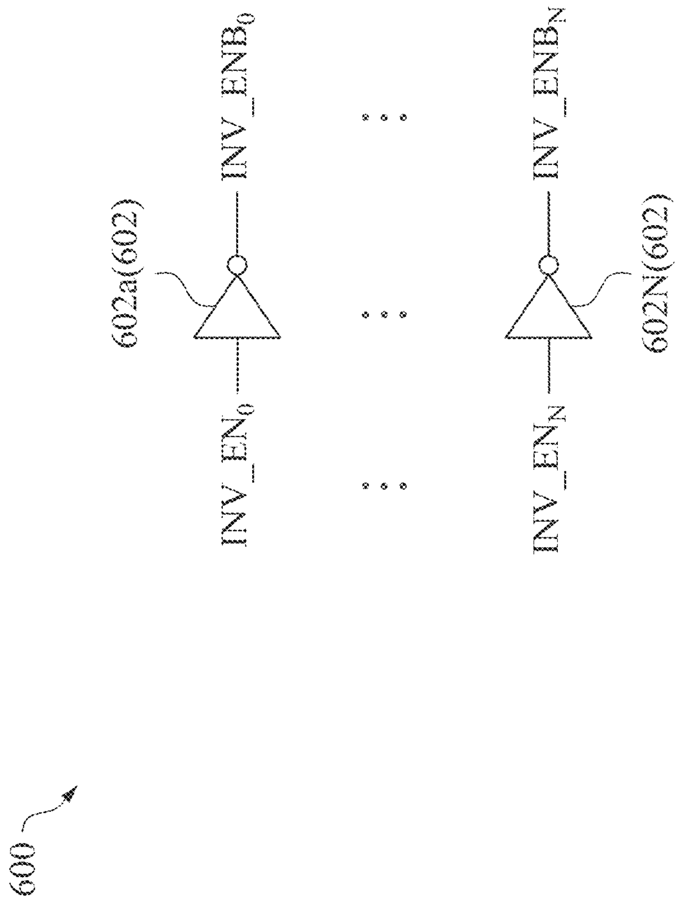
FIG. 6 is a circuit diagram of a circuit, in accordance with some embodiments.

FIG. 6 is a circuit diagram of a circuit 600, in accordance with some embodiments.

Circuit 600 is an embodiment of circuit 404 of FIG. 4, and similar detailed description is therefore omitted.

Circuit 600 is configured to generate at least the set of inverted enable signals INV_ENB in response to at least the set of enable signals INV_EN. In some embodiments, the set of inverted enable signals INV_ENB is inverted from the set of enable signals INV_EN.

In some embodiments, the set of inverted enable signals INV_ENB is usable by at least one of memory circuit 400, write circuit 406, write circuit 500A or write circuit 500B.

Circuit 600 includes a set of inverters 602.

In some embodiments, the set of inverters 602 comprises one or more of inverters 602*a*, 602*b*, . . . , 602N.

Inverter 602*a*, 602*b*, . . . , 602N of the set of inverters 602 is configured to generate a corresponding inverted enable signal $INV\_ENB_0$, $INV\_ENB_1$, . . . $INV\_ENB_N$ of the set of inverted enable signals INV_ENB in response to a corresponding enable signal $INV\_EN_0$, $INV\_EN_1$, . . . $INV\_EN_N$ of the set of enable signals INV_EN.

Each inverter 602*a*, 602*b*, . . . , 602N of the set of inverters 602 is coupled between write circuit 402 and circuit 406.

In some embodiments, inverter 602*a*, 602*b*, . . . , 602N of the set of inverters 602 is coupled between write circuit 402 and corresponding inverter 502*a*, 502*b*, . . . , 502N of the set of inverters 502.

In some embodiments, inverter 602*a*, 602*b*, . . . , 602N of the set of inverters 602 is coupled between write circuit 402 and corresponding inverter 516*a*, 516*b*, . . . , 516N of the set of inverters 516.

Other configurations or quantities of elements in circuit 600 are within the scope of the present disclosure.

Figure 7A:
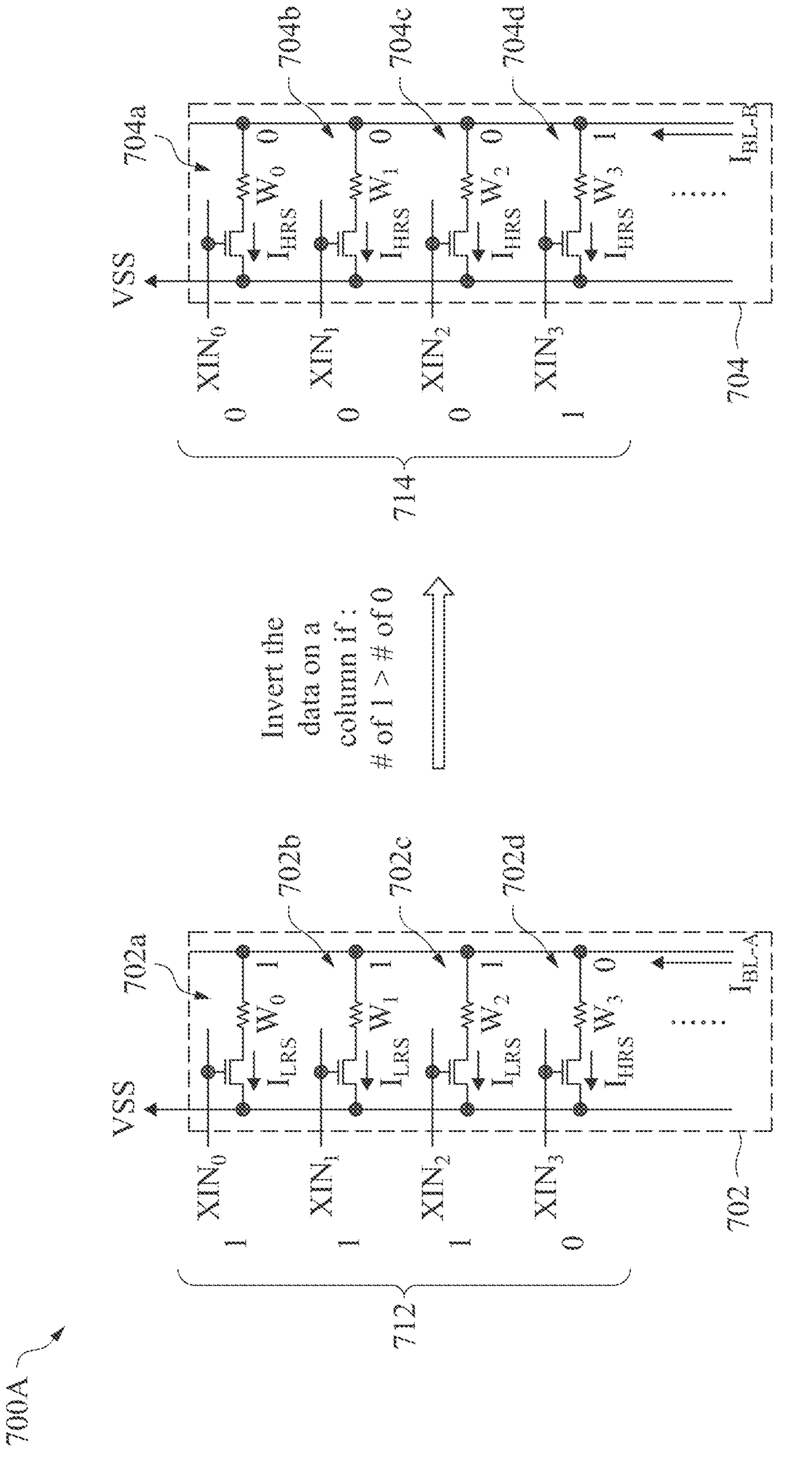
FIGS. 7A-7B are a corresponding circuit diagram of a corresponding memory circuit, in accordance with some embodiments.
Figure 7B:
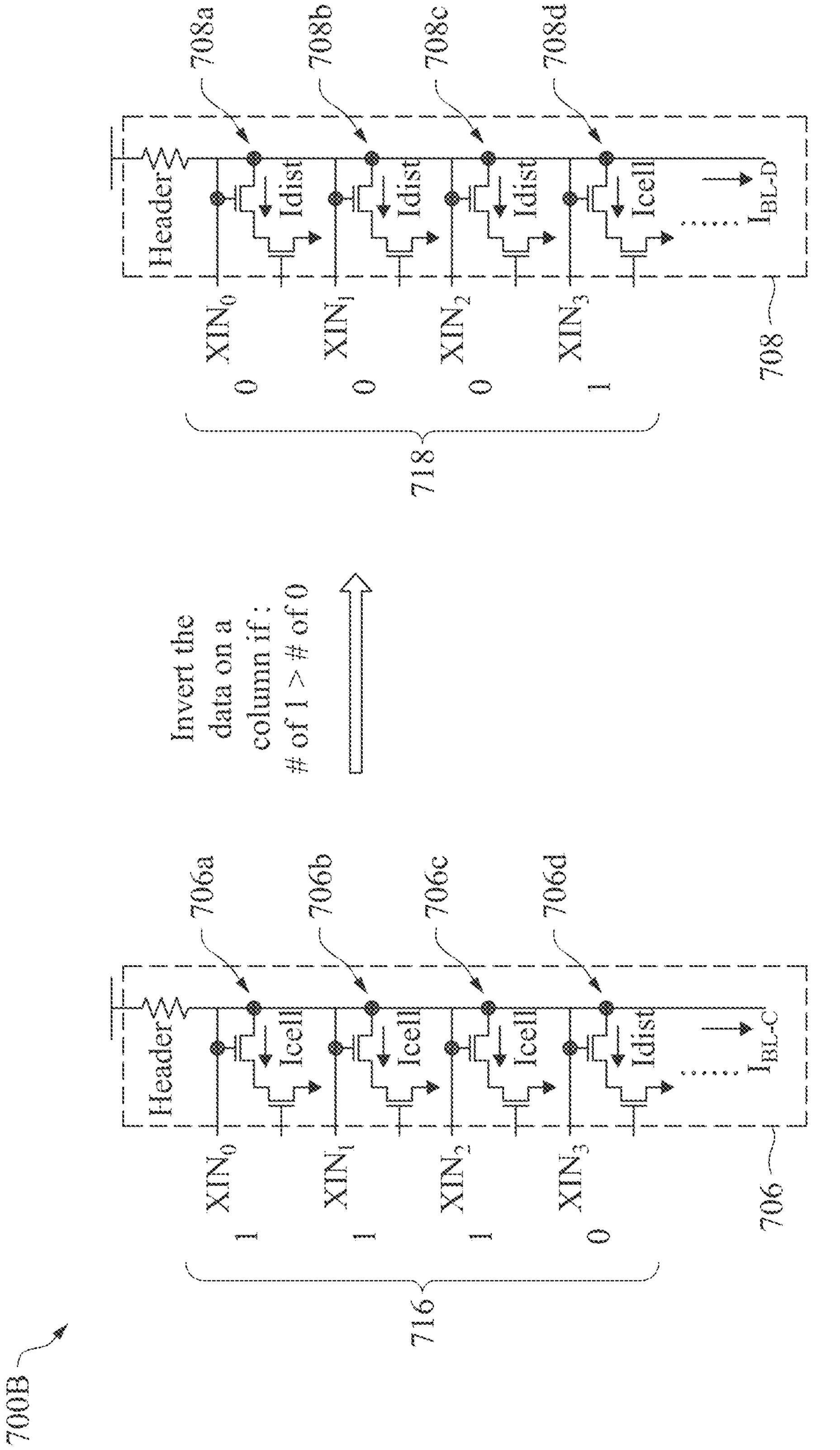

FIGS. 7A-7B are a corresponding circuit diagram of a corresponding memory circuit 700A-700B, in accordance with some embodiments.

Memory circuit 700A is an embodiment of memory macro 110 of FIG. 1 or memory macro 204 of FIG. 2, and similar detailed description is therefore omitted.

Memory circuit 700A is an embodiment of memory array 112 of FIG. 1, and similar detailed description is therefore omitted.

In some embodiments, memory circuit 700A depicts a non-limiting example where inverted data 714 stored in a column of memory cells 704 consumes less energy than data 712 stored in a column of memory cells 702, and similar detailed description is therefore omitted.

Memory circuit 700A includes a column of memory cells 702 and a column of memory cells 704.

In some embodiments, at least one of the column of memory cells 702 or the column of memory cells 704 corresponds to one column of memory cells in memory array 112 of FIG. 1 or memory macro 204 of FIG. 2, and similar detailed description is therefore omitted.

The column of memory cells 702 comprises memory cells 702*a*, 702*b*, 702*c* and 702*d*. In some embodiments, each of memory cell 702*a*, 702*b*, 702*c* and 702*d* is a non-volatile memory cell. Each of the memory cells 702*a*, 702*b*, 702*c* and 702*d* are coupled together by a bit line (not labeled). The bit line has a current $I_{BL-A}$.

Each of memory cells 702*a*, 702*b* and 702*c* have a logic 1 stored therein. Memory cell 702*d* has a logic 0 stored therein. In some embodiments, a logic 1 consumes more energy than a logic 0, and thus the peak value of current $I_{BL-A}$ is greater than memory cells that store less logic 1s (for example, column of memory cells 704).

In some embodiments, since the number of logic 1s is greater than then the number of logic 0s in the column of memory cells 702, if the data stored in the column of memory cells 702 were inverted (for example, as shown in the column of memory cells 704), then the column of memory cells 702 would consume less energy since a logic 1 consumes more energy than a logic 0.

The column of memory cells 704 comprises memory cells 704*a*, 704*b*, 704*c* and 704*d*. In some embodiments, each of memory cell 704*a*, 704*b*, 704*c* and 704*d* is a non-volatile memory cell. Each of the memory cells 704*a*, 704*b*, 704*c* and 704*d* are coupled together by a bit line (not labeled). The bit line has a current $I_{BL-B}$.

Each of memory cells 704*a*, 704*b* and 704*c* have a logic 0 stored therein. Memory cell 704*d* has a logic 1 stored therein.

Data 714 stored in the column of memory cells 704 is inverted from the data 712 stored in the column of memory cells 702. In some embodiments, the number of logic 0s in the column of memory cells 704 is greater than the number of logic 1s in the column of memory cells 704, thus the column of memory cells 704 consumes less energy than the column of memory cells 702, and thus the peak value of current $I_{BL-B}$ is less than the peak value of current $I_{BL-A}$.

Other configurations or quantities of elements in memory circuit 700A are within the scope of the present disclosure.

Memory circuit 700B is a variation of memory circuit 700A of FIG. 7A, and similar detailed description is therefore omitted. In comparison with memory circuit 700A of FIG. 7A, column of memory cells 706 and 708 are SRAM cells, and similar detailed description is therefore omitted.

Memory circuit 700B is an embodiment of memory macro 110 of FIG. 1 or memory macro 204 of FIG. 2, and similar detailed description is therefore omitted.

Memory circuit 700B is an embodiment of memory array 112 of FIG. 1, and similar detailed description is therefore omitted.

In some embodiments, memory circuit 700B depicts a non-limiting example where inverted data 718 stored in a column of memory cells 708 consumes less energy than data 716 stored in a column of memory cells 706, and similar detailed description is therefore omitted.

Memory circuit 700B includes a column of memory cells 706 and a column of memory cells 708.

In some embodiments, at least one of the column of memory cells 706 or the column of memory cells 708 corresponds to one column of memory cells in memory array 112 of FIG. 1 or memory macro 204 of FIG. 2, and similar detailed description is therefore omitted.

The column of memory cells 706 comprises memory cells 706*a*, 706*b*, 706*c* and 706*d*. In some embodiments, each of memory cell 706*a*, 706*b*, 706*c* and 706*d* is an SRAM memory cell. Each of the memory cells 706*a*, 706*b*, 706*c* and 706*d* are coupled together by a bit line (not labeled). The bit line has a current $I_{BL-C}$.

Each of memory cells 706*a*, 706*b* and 706*c* have a logic 1 stored therein. Memory cell 706*d* has a logic 0 stored therein. In some embodiments, a logic 1 consumes more energy than a logic 0, and thus the peak value of current $I_{BL-C}$ is greater than memory cells that store less logic 1s (for example, column of memory cells 708).

In some embodiments, since the number of logic 1s is greater than then the number of logic 0s in the column of memory cells 706, if the data stored in the column of memory cells 706 were inverted (for example, as shown in the column of memory cells 708), then the column of memory cells 706 would consume less energy since a logic 1 consumes more energy than a logic 0.

The column of memory cells 708 comprises memory cells 708*a*, 708*b*, 708*c* and 708*d*. In some embodiments, each of memory cell 708*a*, 708*b*, 708*c* and 708*d* is an SRAM memory cell. Each of the memory cells 708*a*, 708*b*, 708*c* and 708*d* are coupled together by a bit line (not labeled). The bit line has a current $I_{BL-D}$.

Each of memory cells 708*a*, 708*b* and 708*c* have a logic 0 stored therein. Memory cell 708*d* has a logic 1 stored therein.

Data 718 stored in the column of memory cells 708 is inverted from the data 716 stored in the column of memory cells 706. In some embodiments, the number of logic 0s in the column of memory cells 708 is greater than the number of logic 1s in the column of memory cells 708, thus the column of memory cells 708 consumes less energy than the column of memory cells 706, and thus the peak value of current $I_{BL-D}$ is less than the peak value of current $I_{BL-A}$.

In some embodiments, data 714 stored in the column of memory cells 704 or data 718 stored in the column of memory cells 708 is stored data of the set of stored data DO'.

Other configurations or quantities of elements in memory circuit 700B are within the scope of the present disclosure.

Figure 8:
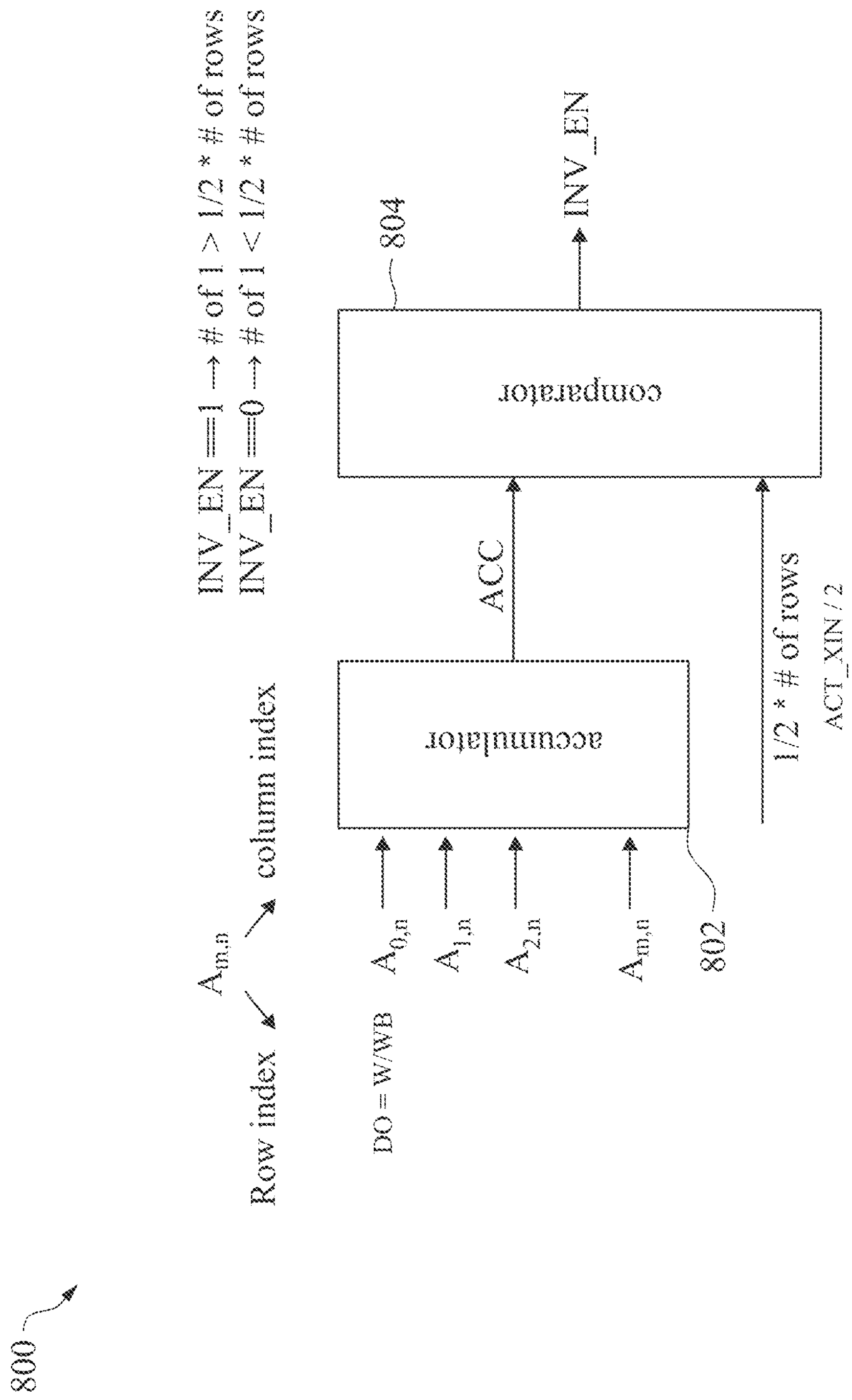
FIG. 8 is a circuit diagram of a write circuit, in accordance with some embodiments.

FIG. 8 is a circuit diagram of a write circuit 800, in accordance with some embodiments.

The write circuit 800 is an embodiment of write circuit 402 of FIG. 4, and similar detailed description is therefore omitted.

The write circuit 800 is configured to receive at least the count signal ACT_XIN/2 or a set of stored data DO. In some embodiments, the count signal ACT_XIN is received from counter 306 in FIG. 3. In some embodiments, the count signal ACT_XIN/2 is received from a divider circuit (not shown), and the divider circuit (not shown) is coupled to the counter 306 in FIG. 3.

In some embodiments, the set of stored data DO is received from write circuit 406. In some embodiments, the set of stored data DO includes a set of weight signals W or a set of inverted weight signals WB.

The write circuit 800 is configured to generate at least the set of enable signals INV_EN in response to at least the set of stored data DO and a count signal ACT_XIN/2. In some embodiments, the count signal ACT_XIN/2 is equal to ½ the count signal ACT_XIN that is generated by the counter 306 in FIG. 3.

In some embodiments, the set of enable signals INV_EN is usable by at least one of memory circuit 400, circuit 404, write circuit 406, read circuit 408, write circuit 500A, write circuit 500B or circuit 600.

The write circuit 800 includes an accumulator 802 and a comparator 804.

An input of the accumulator 802 is coupled to the write circuit 406. An input of the accumulator 802 is coupled to a first input of the comparator 804.

In some embodiments, each row and column of data entries of the set of weight signals W or the set of inverted weight signals WB of the set of weight write circuit 406 are coupled to the accumulator 802.

Accumulator 802 is configured to generate a set of accumulation signals ACC in response to the set of stored data DO. In some embodiments, accumulator 802 is configured to generate the set of accumulation signals ACC in response to the set of weight signals W or the set of inverted weight signals WB.

In some embodiments, the set of accumulation signals ACC includes one or more of accumulation signals ACCa, ACCb, . . . , ACCN.

In some embodiments, the accumulator 802 is configured to determine a number of rows for a single column in the set of stored data DO that has a value equal to a logically high (e.g., logic 1). In some embodiments, each accumulation signal ACCa, ACCb, . . . , ACCN of the set of accumulation signals ACC is a number of rows for the corresponding column in the set of stored data DO that has a value equal to a logically high (e.g., logic 1).

Other variations of the accumulator 802 are within the scope of the present disclosure. In some embodiments, the accumulator 802 is configured to determine a number of rows for a single column in the set of stored data DO that has a value equal to a logically low (e.g., logic 0). In some embodiments, each accumulation signal ACCa, ACCb, . . . , ACCN of the set of accumulation signals ACC is a number of rows for the corresponding column in the set of stored data DO that has a value equal to a logically low (e.g., logic 0).

In some embodiments, the accumulator 802 is configured to accumulate each value of one column of stored data in the set of stored data DO. In some embodiments, the accumulator 802 is configured to add each value of one column of stored data in the set of stored data DO together. For example, in some embodiments, for column 1 of the stored data in the set of stored data DO, if the number of values that is equal to logically high (e.g., logic 1) is 7, then the accumulator 802 is configured to determine that the accumulation signal ACC0 of the set of accumulation signals ACC is equal to 7.

In some embodiments, the accumulator 802 includes an adder that is useable to perform addition operations or other arithmetic/logical operations. In some embodiments, the accumulator 802 further includes a register or a memory location that is useable to store the results of the addition operations or other arithmetic/logical operations.

The comparator 804 is connected to the accumulator 802 and a source of counter signal ACT_XIN/2. In some embodiments, the source of counter signal ACT_XIN/2 is a divider (not shown) that is coupled to counter 306 in FIG. 3.

The comparator 804 is configured to receive the set of accumulation signals ACC, and the counter signal ACT_XIN/2. The comparator 804 is configured to compare the set of accumulation signals ACC and the counter signal ACT_XIN/2. The comparator 804 is configured to generate the set of enable signals INV_EN based on the comparison of the set of accumulation signals ACC and the counter signal ACT_XIN/2.

In some embodiments, the comparator 804 is configured to generate enable signal $INV\_EN_0$, $INV\_EN_1$, . . . , $INV\_EN_N$ of the set of enable signals INV_EN based on a comparison of the corresponding accumulation signal ACCa, ACCb, . . . , ACCN of the set of accumulation signals ACC and the counter signal ACT_XIN/2.

For example, if a number of rows for a single column in the set of stored data DO that have a value equal to a logically high (e.g., logic 1) is greater than ½ the number of the number of active word line signals Xin received from the set of word line drivers 302 (e.g., control signal ACT_XIN/2), then the set of enable signals INV_EN is logically high (e.g., logic 1), in accordance with some embodiments. For example, if a number of rows for column 1 in the stored data D0 of the set of stored data DO that has a value equal to logically high (e.g., logic 1) is greater than ½ the number of the number of active word line signals Xin received from the set of word line drivers 302 (e.g., control signal ACT_XIN/2), then enable signal $INV\_EN_0$ of the set of enable signals INV_EN is logically high (e.g., logic 1), in accordance with some embodiments.

For example, if a number of rows for a single column in the set of stored data DO that have a value equal to a logically high (e.g., logic 1) is less than ½ the number of the number of active word line signals Xin received from the set of word line drivers 302 (e.g., control signal ACT_XIN/2), then the set of enable signals INV_EN is logically low (e.g., logic 0), in accordance with some embodiments. For example, if a number of rows for column 1 in the stored data D0 of the set of stored data DO that has a value equal to logically high (e.g., logic 1) is less than ½ the number of the number of active word line signals Xin received from the set of word line drivers 302 (e.g., control signal ACT_XIN/2), then enable signal $INV\_EN_0$ of the set of enable signals INV_EN is logically low (e.g., logic 0), in accordance with some embodiments.

Other variations of the comparator 804 are within the scope of the present disclosure. For example, if a number of rows for a single column in the set of stored data DO that have a value equal to a logically high (e.g., logic 1) is greater than ½ the number of the number of active word line signals Xin received from the set of word line drivers 302 (e.g., control signal ACT_XIN/2), then the set of enable signals INV_EN is logically low (e.g., logic 0), in accordance with some embodiments. For example, if a number of rows for column 1 in the stored data D0 of the set of stored data DO that has a value equal to logically high (e.g., logic 1) is greater than ½ the number of the number of active word line signals Xin received from the set of word line drivers 302 (e.g., control signal ACT_XIN/2), then enable signal $INV\_EN_0$ of the set of enable signals INV_EN is logically low (e.g., logic 0), in accordance with some embodiments.

For example, if a number of rows for a single column in the set of stored data DO that have a value equal to a logically high (e.g., logic 1) is less than ½ the number of the number of active word line signals Xin received from the set of word line drivers 302 (e.g., control signal ACT_XIN/2), then the set of enable signals INV_EN is logically high (e.g., logic 1), in accordance with some embodiments. For example, if a number of rows for column 1 in the stored data D0 of the set of stored data DO that has a value equal to logically high (e.g., logic 1) is less than ½ the number of the number of active word line signals Xin received from the set of word line drivers 302 (e.g., control signal ACT_XIN/2), then enable signal $INV\_EN_0$ of the set of enable signals INV_EN is logically high (e.g., logic 1), in accordance with some embodiments.

In some embodiments, the set of enable signals INV_EN corresponds to a digital signal with a binary value.

Other configurations or quantities of elements in write circuit 800 are within the scope of the present disclosure.

Figure 9:
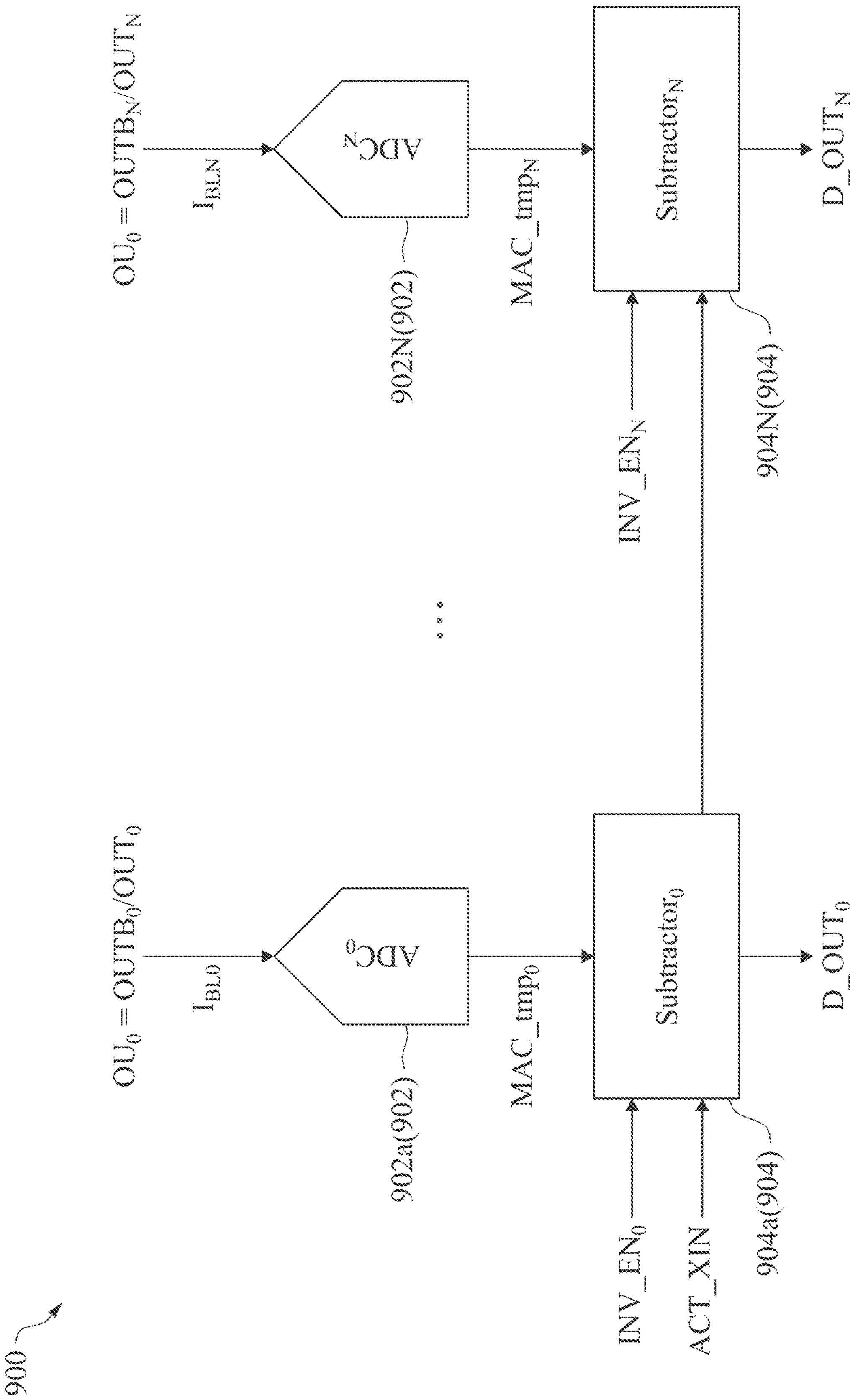
FIG. 9 is a circuit diagram of a read circuit, in accordance with some embodiments.

FIG. 9 is a circuit diagram of a read circuit 900, in accordance with some embodiments.

The read circuit 900 is an embodiment of read circuit 408 of FIG. 4, and similar detailed description is therefore omitted.

The read circuit 900 is coupled to the write circuit 402 and the memory macro 204.

The read circuit 900 is configured to receive at least the set of enable signals INV_EN, the set of output signals OU or the count signal ACT_XIN. In some embodiments, the read circuit 900 is configured to receive at least the set of enable signals INV_EN, the count signal ACT_XIN, and at least one of the set of output signals OUT or the set of output signals OUTB.

In some embodiments, the set of enable signals INV_EN is received from the write circuit 800. In some embodiments, the count signal ACT_XIN is received from the counter 306. In some embodiments, during a read operation of memory macro 204, the set of output signals OU is read from the memory macro 204 in response to at least one of the set of enable signals INV_EN or the count signal ACT_XIN.

The read circuit 900 is configured to output at least the set of output signals D_OUT in response to at least the set of enable signals INV_EN, the set of output signals OU or the count signal ACT_XIN. In some embodiments, the read circuit 900 is configured to generate at least the set of output signals D_OUT in response to at least the set of enable signals INV_EN, the set of output signals OU or the count signal ACT_XIN. In some embodiments, the set of output signals D_OUT corresponds to a set of output signals that would be generated by a CIM macro (e.g., similar to memory macro 204) if one or more of the weight signals of the set of weight signals W were not inverted by write circuit 406.

The read circuit 900 includes a set of analog-to-digital converters (ADC) 902 and a set of subtractors 904.

The set of ADCs 902 is configured to convert an analog signal into a corresponding digital signal. In some embodiments, the set of ADCs 902 is configured to generate a set of digital signals MAC_tmp in response to the set of output signals OU.

In some embodiments, the set of output signals OU is a set of bit line current values $I_{BL}$. In some embodiments, the set of bit line current values $I_{BL}$ includes one or more bit line current values $I_{BL0}$, $I_{BL1}$, . . . , $I_{BLN}$. In some embodiments, the set of bit line current values $I_{BL}$ is a corresponding set of analog signals.

In some embodiments, the set of bit line current values $I_{BL}$ is at least one of current $I_{BL-B}$ of FIG. 7B, and similar detailed description is therefore omitted. In some embodiments, one or more bit line current values $I_{BL0}$, $I_{BL1}$, . . . , $I_{BLN}$ of the set of bit line current values $I_{BL}$ is the current $I_{BL-B}$ of FIG. 7B, and similar detailed description is therefore omitted.

In some embodiments, the set of bit line current values $I_{BL}$ is at least one of current $I_{BL-D}$ of FIG. 7B, and similar detailed description is therefore omitted. In some embodiments, one or more bit line current values $I_{BL0}$, $I_{BL1}$, . . . , $I_{BLN}$ of the set of bit line current values $I_{BL}$ is the current $I_{BL-D}$ of FIG. 7B, and similar detailed description is therefore omitted.

In some embodiments, the set of ADCs 902 includes one or more of ADCs 902*a*, 902*b*, . . . , 902N. In some embodiments, the set of digital signals MAC_tmp includes one or more of digital signals $MAC_tmp_0$, $MAC\_tmp_1$, . . . , $MAC_tmp_N$. In some embodiments, the set of digital signals MAC_tmp is a set of intermediate MAC signals.

In some embodiments, each ADC 902*a*, 902*b*, . . . , 902N of the set of ADCs 902 is configured to generate a corresponding digital signal $MAC_tmp_0$, $MAC\_tmp_1$, . . . , $MAC_tmp_N$ of a set of digital signals MAC_tmp in response to a corresponding output signal $OU_0$, $OU_1$, . . . , $OU_N$ of the set of output signals OU.

In some embodiments, each ADC 902*a*, 902*b*, . . . , 902N of the set of ADCs 902 is coupled to a corresponding column of memory cells in memory array 112. In some embodiments, each ADC 902*a*, 902*b*, . . . , 902N of the set of ADCs 902 is coupled to a corresponding column of memory cells in memory macro 204.

In some embodiments, each ADC 902*a*, 902*b*, . . . , 902N of the set of ADCs 902 is coupled between a corresponding column of memory cells in memory macro 204 and a corresponding subtractor 904*a*, 904*b*, . . . , 904N of the set of subtractors 904.

The set of subtractors 904 is configured to generate the set of output signals D_OUT in response to at least the set of digital signals MAC_tmp, the set of enable signals INV_EN or the count signal ACT_XIN.

In some embodiments, the set of subtractors 904 includes one or more of subtractors 904*a*, 904*b*, . . . , 904N.

In some embodiments, each subtractor 904*a*, 904*b*, . . . , 904N of the set of subtractors 904 is configured to generate the corresponding output signal $D_OUT_0$, $D\_OUT_1$, . . . , $D_OUT_N$ of the set of output signals D_OUT in response to at least a corresponding digital signal $MAC_tmp_0$, $MAC\_tmp_1$, . . . , $MAC_tmp_N$ of the set of digital signals MAC_tmp, a corresponding enable signal $INV\_EN_0$, $INV\_EN_1$, . . . , $INV\_EN_N$ of the set of enable signals INV_EN or the count signal ACT_XIN.

Other variations of the set of subtractors 904 are within the scope of the present disclosure. In some embodiments, each subtractor 904*a*, 904*b*, . . . , 904N of the set of subtractors 904 is configured to generate the corresponding output signal $D_OUT_0$, $D\_OUT_1$, . . . , $D_OUT_N$ of the set of output signals D_OUT in response to at least a corresponding digital signal $MAC_tmp_0$, $MAC\_tmp_1$, . . . , $MAC_tmp_N$ of the set of digital signals MAC_tmp, a corresponding enable signal $INV\_EN_0$, $INV\_EN_1$, . . . , $INV\_EN_N$ of the set of enable signals INV_EN or the corresponding count signal $ACT\_XIN_1$, $ACT\_XIN_2$, . . . , $ACT\_XIN_N$ of the count signal ACT_XIN of the corresponding column of memory cells in memory macro 204.

In some embodiments, subtractor 904*a*, 904*b*, . . . , 904N of the set of subtractors 904 is coupled to a corresponding column of memory cells in memory array 112 by a corresponding ADC 902$a$, 902$b$, . . . , 902N of the set of ADCs 902. In some embodiments, subtractor 904$a$, 904$b$, . . . , 904N of the set of subtractors 904 is coupled to a corresponding column of memory cells in memory macro 204 by a corresponding ADC 902$a$, 902$b$, . . . , 902N of the set of ADCs 902.

In some embodiments, each ADC 902$a$, 902$b$, . . . , 902N of the set of ADCs 902 and each subtractor 904$a$, 904$b$, . . . , 904N of the set of subtractors 904 is coupled to a corresponding column of memory cells in the memory cell array.

In some embodiments, at least one of output signal $D_OUT_0$, $D\_OUT_1$, . . . , $D_OUT_N$ of the set of output signals D_OUT is set equal to logically low (e.g., logic 0) or logically high (e.g., logic 1) by the corresponding subtractor 904$a$, 904$b$, . . . , 904N of the set of subtractors 904.

In some embodiments, if the corresponding enable signal $INV\_EN_0$, $INV\_EN_1$, . . . , $INV\_EN_N$ of the set of enable signals INV_EN is equal to a logically high signal (e.g., logic 1), then the corresponding output signal $D_OUT_0$, $D\_OUT_1$, . . . , $D_OUT_N$ of the set of output signals D_OUT is determined by the corresponding subtractor 904$a$, 904$b$, . . . , 904N of the set of subtractors 904 according to formula 1 (shown below). Formulas 1 and 2 are written with reference to the set of output signals D_OUT and the set of output signals MAC_TMP, but are applicable to each corresponding output signal $D_OUT_0$, $D\_OUT_1$, . . . , $D_OUT_N$ and each corresponding digital signal $MAC_tmp_0$, $MAC\_tmp_1$, . . . , $MAC_tmp_N$. (as described in the examples below).

$$D\_OUT=ACT\_XIN-MAC\_TMP \quad (1)$$

In some embodiments, if the corresponding enable signal $INV\_EN_0$, $INV\_EN_1$, . . . , $INV\_EN_N$ of the set of enable signals INV_EN is equal to a logically low signal (e.g., logic 0), then the corresponding output signal $D_OUT_0$, $D\_OUT_1$, . . . , $D_OUT_N$ of the set of output signals D_OUT is determined by the corresponding subtractor 904$a$, 904$b$, . . . , 904N of the set of subtractors 904 according to formula 2 (shown below).

$$D\_OUT=MAC\_TMP \quad (2)$$

For example, in some embodiments, if the enable signal $INV\_EN_0$ is equal to a logically high signal (e.g., logic 1), then the output signal $D_OUT_0$ is determined by subtractor 904$a$ according to formula 1 (shown below). In this non-limiting example, if the count signal ACT_XIN is equal to 7, and the digital signal $MAC_tmp_0$ is equal to 6, then applying formula 1 results in the output signal D_OUT0 being equal to 1.

For example, in some embodiments, if the enable signal $INV\_EN_0$ is equal to a logically low signal (e.g., logic 0), then the output signal $D_OUT_0$ is determined by subtractor 904$a$ according to formula 1 (shown below). In this non-limiting example, if the count signal ACT_XIN is equal to 7, and the digital signal $MAC_tmp_0$ is equal to 6, then applying formula 1 results in the output signal D_OUT0 being equal to 6.

In some embodiments, each corresponding enable signal $INV\_EN_0$, $INV\_EN_1$, . . . , $INV\_EN_N$ of the set of enable signals INV_EN is a corresponding enable signal useable to enable or disable the corresponding subtractor 904$a$, 904$b$, . . . , 904N of the set of subtractors 904. In some embodiments, the subtractor 904$a$, 904$b$, . . . , 904N of the set of subtractors 904 is enabled when the corresponding enable signal $INV\_EN_0$, $INV\_EN_1$, . . . , $INV\_EN_N$ of the set of enable signals INV_EN is a logically high signal (e.g., logic 1). In some embodiments, the subtractor 904$a$, 904$b$, . . . , 904N of the set of subtractors 904 is disabled when the corresponding enable signal $INV\_EN_0$, $INV\_EN_1$, . . . , $INV\_EN_N$ of the set of enable signals INV_EN is a logically low signal (e.g., logic 0).

In some embodiments, if the subtractor 904$a$, 904$b$, . . . , 904N of the set of subtractors 904 is enabled, then the corresponding subtractor 904$a$, 904$b$, . . . , 904N of the set of subtractors 904 will perform the subtraction operation according to formula 1 to determine the corresponding output signal $D_OUT_0$, $D\_OUT_1$, . . . , $D_OUT_N$ of the set of output signals D_OUT.

In some embodiments, if the subtractor 904$a$, 904$b$, . . . , 904N of the set of subtractors 904 is disabled, then the corresponding subtractor 904$a$, 904$b$, . . . , 904N of the set of subtractors 904 will determine the corresponding output signal $D_OUT_0$, $D\_OUT_1$, . . . , $D_OUT_N$ of the set of output signals D_OUT according to formula 2. In these embodiments, the corresponding subtractor 904$a$, 904$b$, . . . , 904N of the set of subtractors 904 will pass the corresponding input signal (e.g., corresponding digital signal $MAC_tmp_0$, $MAC\_tmp_1$, . . . , $MAC_tmp_N$ of the set of digital signals MAC_tmp) as the corresponding output signal $D_OUT_0$, $D\_OUT_1$, . . . , $D_OUT_N$ of the set of output signals D_OUT.

Other variations of the set of subtractors 904 are within the scope of the present disclosure. In some embodiments, the subtractor 904$a$, 904$b$, . . . , 904N of the set of subtractors 904 is enabled when the corresponding enable signal $INV\_EN_0$, $INV\_EN_1$, . . . , $INV\_EN_N$ of the set of enable signals INV_EN is a logically low signal (e.g., logic 0). In some embodiments, the subtractor 904$a$, 904$b$, . . . , 904N of the set of subtractors 904 is disabled when the corresponding enable signal $INV\_EN_0$, $INV\_EN_1$, . . . , $INV\_EN_N$ of the set of enable signals INV_EN is a logically high signal (e.g., logic 1). In some embodiments, formula 1 is usable by the corresponding subtractor 904$a$, 904$b$, . . . , 904N of the set of subtractors 904 when disabled. In some embodiments, formula 2 is usable by the corresponding subtractor 904$a$, 904$b$, . . . , 904N of the set of subtractors 904 when enabled.

Figure 10A:
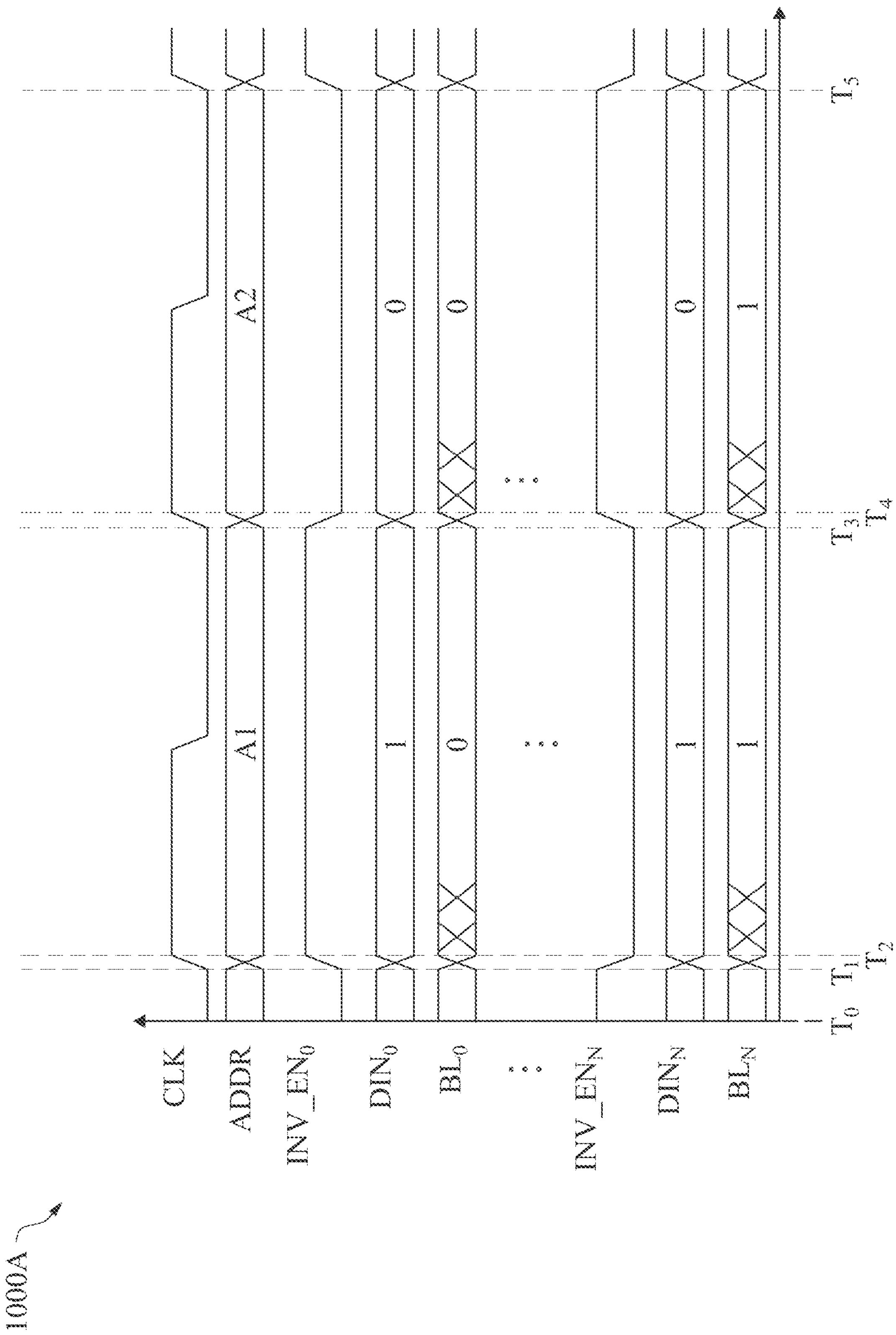
FIGS. 10A-10B are corresponding graphs of corresponding waveforms, in accordance with some embodiments.
Figure 10B:
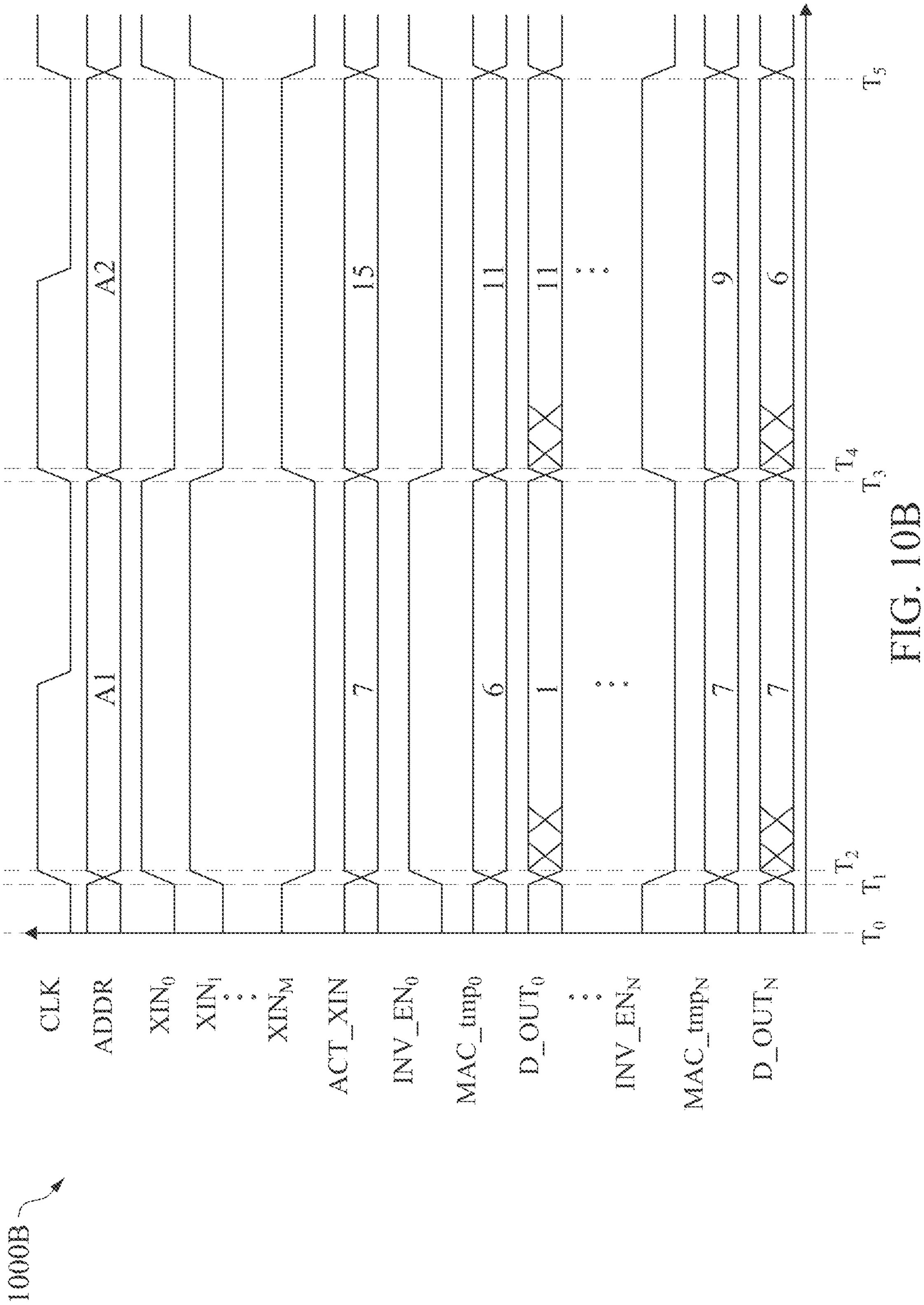

Further operations of read circuit 900 are further described in waveforms 1000A-1000B of corresponding FIGS. 10A-10B.

Other configurations or quantities of elements in read circuit 900 are within the scope of the present disclosure.

FIGS. 10A-10B are corresponding graphs of corresponding waveforms 1000A-1000B, in accordance with some embodiments.

In some embodiments, waveform 1000A is an example of operation of the write circuit 500A of FIG. 5A, and similar detailed description is therefore omitted.

In some embodiments, waveform 1000B is an example of operation of the read circuit 900 of FIG. 9, and similar detailed description is therefore omitted.

In some embodiments, from time T1-T3 of FIGS. 10A-10B, the address signal ADDR corresponds to address A1 of memory macro 204, and from time T3-T6 of FIGS. 10A-10B, the address signal ADDR corresponds to address A2 of memory macro 204.

In some embodiments, bit line signal $BL_0$, $BL_1$, . . . , $BL_N$ is corresponding stored data signal $DO_0$, $DO_1$, . . . , $DO_N$ of the set of stored data DO of at least FIGS. 5A-5B, and similar detailed description is therefore omitted.

In some embodiments, for brevity waveforms 1000A-100B are described with respect to column 0 and column N of memory macro 204, but is applicable to each column of memory cells in memory macro 204.

At time T0, a clock signal CLK of memory macro 204 is equal to logic 0, an address signal ADDR of address A1 of memory macro 204 is equal to logic 0, an address signal ADDR of address A2 of memory macro 204 is equal to logic 1, the enable signal $INV\_EN_0$ of corresponding column 0 of memory macro 204 is equal to logic 0, the corresponding weight signal $DIN_0$ is equal to logic 0, the corresponding bit line signal $BL_0$ is equal to logic 1, the enable signal $INV\_EN_N$ of corresponding column N of memory macro 204 is equal to logic 1, the corresponding weight signal $DIN_N$ is equal to logic 0, and the corresponding bit line signal $BL_N$ is equal to logic 0.

At time T1, the clock signal CLK of memory macro 204 transitions to logic 1, the address signal ADDR of address A1 of memory macro 204 transitions to logic 1, the address signal ADDR of address A2 of memory macro 204 transitions to logic 0, the enable signal $INV\_EN_0$ of corresponding column 0 of memory macro 204 transitions to logic 1, the corresponding weight signal $DIN_0$ transitions to logic 1, the corresponding bit line signal $BL_0$ transitions to logic 0, the enable signal $INV\_EN_N$ of corresponding column N of memory macro 204 transitions to logic 0, the corresponding weight signal $DIN_N$ transitions to logic 1, and the corresponding bit line signal $BL_N$ transitions to logic 1.

In response to the enable signal $INV\_EN_0$ of corresponding column 0 of memory macro 204 transitioning to logic 1 causes inverter 506*a* to turn off, and causes inverter 502*a* to turn on (since the inverted enable signal $INV\_ENB_0$ transitions to logic 0 (not shown in FIG. 10A)). In response to inverter 502*a* turning on, causes inverter 502*a* to invert the weight signal $DIN_0$ (which is transitioning to logic 1) thus causing the corresponding bit line signal $BL_0$ to transition to logic 0.

In response to the enable signal $INV\_EN_N$ of corresponding column N of memory macro 204 transitioning to logic 0 causes inverter 506*a* to turn on, and causes inverter 502*a* to turn off (since the inverted enable signal $INV\_ENB_N$ transitions to logic 1 (not shown in FIG. 10A)). In response to inverter 506*a* turning on, causes inverter 506*a* to invert the inverted weight signal $DINB_N$ (not shown in FIG. 10A) which is transitioning to logic 0) thus causing the corresponding bit line signal $BL_0$ to transition to logic 1. In some embodiments, the inverted weight signal $DINB_N$ (not shown in FIG. 10A) is transitioning to logic 0 in response to the transition of the weight signal $DIN_N$ to logic 1 since inverter 504*a* inverts the weight signal $DIN_N$.

At time T2, the clock signal CLK of memory macro 204 is equal to logic 1, the address signal ADDR of address A1 of memory macro 204 is equal to logic 1, the address signal ADDR of address A2 of memory macro 204 is equal to logic 0, the enable signal $INV\_EN_0$ of corresponding column 0 of memory macro 204 is equal to logic 1, the corresponding weight signal $DIN_0$ is equal to logic 1, the corresponding bit line signal $BL_0$ is equal to logic 0, the enable signal $INV\_EN_N$ of corresponding column N of memory macro 204 is equal to logic 0, the corresponding weight signal $DIN_N$ is equal to logic 1, and the corresponding bit line signal $BL_N$ is equal to logic 1.

In response to the enable signal $INV\_EN_0$ of corresponding column 0 of memory macro 204 being logic 1 causes inverter 506*a* to turn off, and causes inverter 502*a* to turn on (since the inverted enable signal $INV\_ENB_0$ is logic 0 (not shown in FIG. 10A)). In response to inverter 502*a* turning on, causes inverter 502*a* to invert the weight signal $DIN_0$ (which is logic 1) thus causing the corresponding bit line signal $BL_0$ to be logic 0.

In response to the enable signal $INV\_EN_N$ of corresponding column N of memory macro 204 being logic 0 causes inverter 506*a* to turn on, and causes inverter 502*a* to turn off (since the inverted enable signal $INV\_ENB_N$ is logic 1 (not shown in FIG. 10A)). In response to inverter 506*a* turning on, causes inverter 506*a* to invert the inverted weight signal $DINB_N$ (not shown in FIG. 10A) which is logic 0) thus causing the corresponding bit line signal $BL_0$ to be logic 1. In some embodiments, the inverted weight signal $DINB_N$ (not shown in FIG. 10A) is logic 0 in response to the weight signal $DIN_N$ being logic 1 since inverter 504*a* inverts the weight signal $DIN_N$.

At time T3, the clock signal CLK of memory macro 204 transitions to logic 1, the address signal ADDR of address A1 of memory macro 204 transitions to logic 0, the address signal ADDR of address A2 of memory macro 204 transitions to logic 1, the enable signal $INV\_EN_0$ of corresponding column 0 of memory macro 204 transitions to logic 0, the corresponding weight signal $DIN_0$ transitions to logic 0, the corresponding bit line signal $BL_0$ transitions to logic 1, the enable signal $INV\_EN_N$ of corresponding column N of memory macro 204 transitions to logic 1, the corresponding weight signal $DIN_N$ transitions to logic 0, and the corresponding bit line signal $BL_N$ transitions to logic 0.

In response to the enable signal $INV\_EN_0$ of corresponding column N of memory macro 204 transitioning to logic 0 causes inverter 506*a* to turn on, and causes inverter 502*a* to turn off (since the inverted enable signal $INV\_ENB_0$ transitions to logic 1 (not shown in FIG. 10A)). In response to inverter 506*a* turning on, causes inverter 506*a* to invert the inverted weight signal $DINB_0$ (not shown in FIG. 10A) which is transitioning to logic 1) thus causing the corresponding bit line signal $BL_0$ to transition to logic 0. In some embodiments, the inverted weight signal $DINB_0$ (not shown in FIG. 10A) is transitioning to logic 1 in response to the transition of the weight signal $DIN_0$ to logic 0 since inverter 504*a* inverts the weight signal $DIN_0$.

In response to the enable signal $INV\_EN_N$ of corresponding column N of memory macro 204 transitioning to logic 1 causes inverter 506*a* to turn off, and causes inverter 502*a* to turn on (since the inverted enable signal $INV\_ENB_N$ transitions to logic 0 (not shown in FIG. 10A)). In response to inverter 502*a* turning on, causes inverter 502*a* to invert the weight signal $DIN_N$ (which is transitioning to logic 0) thus causing the corresponding bit line signal $BL_N$ to transition to logic 1.

At time T4, the clock signal CLK of memory macro 204 is equal to logic 1, the address signal ADDR of address A1 of memory macro 204 is equal to logic 0, the address signal ADDR of address A2 of memory macro 204 is equal to logic 1, the enable signal $INV\_EN_0$ of corresponding column 0 of memory macro 204 is equal to logic 0, the corresponding weight signal $DIN_0$ is equal to logic 0, the corresponding bit line signal $BL_0$ is equal to logic 1, the enable signal $INV\_EN_N$ of corresponding column N of memory macro 204 is equal to logic 1, the corresponding weight signal $DIN_N$ is equal to logic 0, and the corresponding bit line signal $BL_N$ is equal to logic 0.

In response to the enable signal $INV\_EN_0$ of corresponding column N of memory macro 204 being logic 0 causes inverter 506*a* to turn on, and causes inverter 502*a* to turn off (since the inverted enable signal $INV\_ENB_0$ is logic 1 (not shown in FIG. 10A)). In response to inverter 506*a* turning on, causes inverter 506*a* to invert the inverted weight signal $DINB_0$ (not shown in FIG. 10A) which is logic 1) thus causing the corresponding bit line signal $BL_0$ to be logic 0. In some embodiments, the inverted weight signal $DINB_0$ (not shown in FIG. 10A) is logic 1 in response to the weight signal $DIN_0$ being logic 0 since inverter 504*a* inverts the weight signal $DIN_0$.

In response to the enable signal $INV\_EN_N$ of corresponding column N of memory macro 204 being logic 1 causes inverter 506*a* to turn off, and causes inverter 502*a* to turn on (since the inverted enable signal $INV\_ENB_N$ is logic 0 (not shown in FIG. 10A)). In response to inverter 502*a* turning on, causes inverter 502*a* to invert the weight signal $DIN_N$ (which is transitioning to logic 0) thus causing the corresponding bit line signal $BL_N$ to be logic 1.

At time T5, the clock signal CLK of memory macro 204 transitions to logic 1, the address signal ADDR of address A1 of memory macro 204 transitions to logic 1, the address signal ADDR of address A2 of memory macro 204 transitions to logic 0, the enable signal $INV\_EN_0$ of corresponding column 0 of memory macro 204 transitions to logic 1, the corresponding weight signal $DIN_0$ transitions to logic 1, the corresponding bit line signal $BL_0$ transitions to logic 0, the enable signal $INV\_EN_N$ of corresponding column N of memory macro 204 transitions to logic 0, the corresponding weight signal $DIN_N$ transitions to logic 1, and the corresponding bit line signal $BL_N$ transitions to logic 1.

Other configurations of waveform 1000A are within the scope of the present disclosure.

FIG. 10B is a corresponding graph of corresponding waveform 1000B, in accordance with some embodiments.

At time T0, a clock signal CLK of memory macro 204 is equal to logic 0, an address signal ADDR of address A1 of memory macro 204 is equal to logic 0, an address signal ADDR of address A2 of memory macro 204 is equal to logic 1, the input signal $Xin_0$ is equal to logic 0, the input signal $Xin_1$ is equal to logic 0, the input signal $Xin_M$ is equal to logic 1, the count signal ACT_XIN is equal to a value 0, the enable signal $INV\_EN_0$ of corresponding column 0 of memory macro 204 is equal to logic 0, the digital signal $MAC_tmp_0$ is equal to number 0, the output signal $D_OUT_0$ is equal to number 0, the enable signal $INV\_EN_N$ of corresponding column N of memory macro 204 is equal to logic 1, the digital signal $MAC_tmp_N$ is equal to number 0, and the output signal $D_OUT_N$ is equal to number 0, At time T1, the clock signal CLK of memory macro 204 transitions to logic 1, the address signal ADDR of address A1 of memory macro 204 transitions to logic 1, the address signal ADDR of address A2 of memory macro 204 transitions to logic 0, the input signal $Xin_0$ transitions to logic 1, the input signal $Xin_1$ transitions to logic 1, the input signal $Xin_M$ transitions to logic 0, the count signal ACT_XIN transitions to a value 7, the enable signal $INV\_EN_0$ of corresponding column 0 of memory macro 204 transitions to logic 1, the digital signal $MAC_tmp_0$ transitions to number 6, the output signal $D_OUT_0$ transitions to number 1, the enable signal $INV\_EN_N$ of corresponding column N of memory macro 204 transitions to logic 0, the digital signal $MAC_tmp_N$ transitions to number 7, and the output signal $D_OUT_N$ transitions to number 7.

In response to the enable signal $INV\_EN_0$ of corresponding column 0 of memory macro 204 transitioning to logic 1 causes subtractor 904*a* to be enabled. In response to enabling subtractor 904*a*, thereby causes subtractor 904*a* to apply formula 1 in determining the output signal $D_OUT_0$ based on the digital signal $MAC_tmp_0$ and the count signal ACT_XIN. When the count signal ACT_XIN is equal to a value 7 and the digital signal $MAC_tmp_0$ transitions to number 6, the subtractor 904*a* determines from formula 1 that the output signal $D_OUT_0$ transitions to number 1. For example, 7-6 is equal to 1.

In response to the enable signal $INV\_EN_N$ of corresponding column N of memory macro 204 transitioning to logic 0 causes subtractor 904N to be disabled. In response to disabling subtractor 904N, thereby causes subtractor 904N to apply formula 2 in determining the output signal $D_OUT_N$ based on the digital signal $MAC_tmp_N$. When the digital signal $MAC_tmp_N$ transitions to number 7, the subtractor 904N determines from formula 2 that the output signal $D_OUT_N$ transitions to number 7.

At time T2, the clock signal CLK of memory macro 204 is equal to logic 1, the address signal ADDR of address A1 of memory macro 204 is equal to logic 1, the address signal ADDR of address A2 of memory macro 204 is equal to logic 0, the input signal $Xin_0$ is equal to logic 1, the input signal $Xin_1$ is equal to logic 1, the input signal $Xin_M$ is equal to logic 0, the count signal ACT_XIN is equal to a value 7, the enable signal $INV\_EN_0$ of corresponding column 0 of memory macro 204 is equal to logic 1, the digital signal $MAC_tmp_0$ is equal to number 6, the output signal $D_OUT_0$ is equal to number 1, the enable signal $INV\_EN_N$ of corresponding column N of memory macro 204 is equal to logic 0, the digital signal $MAC_tmp_N$ is equal to number 7, and the output signal $D_OUT_N$ is equal to number 7.

At time T3, the clock signal CLK of memory macro 204 transitions to logic 1, the address signal ADDR of address A1 of memory macro 204 transitions to logic 0, the address signal ADDR of address A2 of memory macro 204 transitions to logic 1, the input signal $Xin_0$ transitions to logic 0, the input signal $Xin_1$ transitions to logic 0, the input signal $Xin_M$ transitions to logic 1, the count signal ACT_XIN transitions to a value 15, the enable signal $INV\_EN_0$ of corresponding column 0 of memory macro 204 transitions to logic 0, the digital signal $MAC_tmp_0$ transitions to number 11, the output signal $D_OUT_0$ transitions to number 11, the enable signal $INV\_EN_N$ of corresponding column N of memory macro 204 transitions to logic 1, the digital signal $MAC_tmp_N$ transitions to number 9, and the output signal $D_OUT_N$ transitions to number 6.

In response to the enable signal $INV\_EN_0$ of corresponding column 0 of memory macro 204 transitioning to logic 0 causes subtractor 904*a* to be disabled. In response to disabling subtractor 904*a*, thereby causes subtractor 904*a* to apply formula 2 in determining the output signal $D_OUT_0$ based on the digital signal $MAC_tmp_0$. When the digital signal $MAC_tmp_0$ transitions to number 11, the subtractor 904*a* determines from formula 2 that the output signal $D_OUT_0$ transitions to number 11.

In response to the enable signal $INV\_EN_N$ of corresponding column N of memory macro 204 transitioning to logic 1 causes subtractor 904N to be enabled. In response to enabling subtractor 904N, thereby causes subtractor 904N to apply formula 1 in determining the output signal $D_OUT_N$ based on the digital signal $MAC_tmp_N$ and the count signal ACT_XIN. When the count signal ACT_XIN is equal to a value 15 and the digital signal $MAC_tmp_N$ transitions to number 9, the subtractor 904N determines from formula 1 that the output signal $D_OUT_N$ transitions to number 6. For example, 15-9 is equal to 6.

At time T4, the clock signal CLK of memory macro 204 is equal to logic 1, the address signal ADDR of address A1 of memory macro 204 is equal to logic 0, the address signal ADDR of address A2 of memory macro 204 is equal to logic 1, the input signal $Xin_0$ is equal to logic 0, the input signal $Xin_1$ is equal to logic 0, the input signal $Xin_M$ is equal to logic 1, the count signal ACT_XIN is equal to a value 15, the enable signal $INV\_EN_0$ of corresponding column 0 of memory macro 204 is equal to logic 0, the digital signal $MAC_tmp_0$ is equal to number 11, the output signal $D_OUT_0$ is equal to number 11, the enable signal $INV\_EN_N$ of corresponding column N of memory macro 204 is equal to logic 1, the digital signal $MAC_tmp_N$ is equal to number 9, and the output signal $D_OUT_N$ is equal to number 6.

At time T5, the clock signal CLK of memory macro 204 transitions to logic 1, the address signal ADDR of address A1 of memory macro 204 transitions to logic 1, the address signal ADDR of address A2 of memory macro 204 transitions to logic 0, the input signal $Xin_0$ transitions to logic 1, the input signal $Xin_1$ transitions to logic 1, the input signal $Xin_M$ transitions to logic 0, the count signal ACT_XIN transitions to a value 0, the enable signal $INV\_EN_0$ of corresponding column 0 of memory macro 204 transitions to logic 1, the digital signal $MAC_tmp_0$ transitions to number 0, the output signal $D_OUT_0$ transitions to number 0, the enable signal $INV\_EN_N$ of corresponding column N of memory macro 204 transitions to logic 0, the digital signal $MAC_tmp_N$ transitions to number 0, and the output signal $D_OUT_N$ transitions to number 0.

In some embodiments, write circuit 500A or 500B achieves one or more benefits discussed herein in the present application.

Other configurations of waveforms 1000B are within the scope of the present disclosure.

FIG. 11A is a schematic diagram of a memory device 1100A, in accordance with some embodiments.

The memory device 1100A comprises memory macros 1102, 1104, 1106, 1108 and memory controller 1120. In some embodiments, one or more of the memory macros 1102, 1104, 1106, 1108 correspond to memory macro 110, and/or memory controller 1120 corresponds to the memory controller 120. In some embodiments, one or more of the memory macros 1102, 1104, 1106, 1108 correspond to memory circuit 102, and/or memory controller 1120 corresponds to the memory controller 120.

In the example configuration in FIG. 11A, the memory controller 1120 is a common memory controller for the memory macros 1102, 1104, 1106, 1108. In at least one embodiment, at least one of the memory macros 1102, 1104, 1106, 1108 has its own memory controller. The number of four memory macros in the memory device 1100A is an example. Other configurations are within the scopes of various embodiments.

The memory macros 1102, 1104, 1106, 1108 are coupled to each other in sequence, with output data of a preceding memory macro being input data for a subsequent memory macro. For example, input data DIN are input into the memory macro 1102. The memory macro 1102 performs one or more CIM operations based on the input data DIN and one of the weight data W or inverted weight data WB (shown in FIG. 1) stored in the memory macro 1102, and generates output data DOUT2 as results of the CIM operations. The output data DOUT2 are supplied as input data DIN4 of the memory macro 1104. The memory macro 1104 performs one or more CIM operations based on the input data DIN4 and one of the weight data W or inverted weight data WB stored in the memory macro 1104, and generates output data DOUT4 as results of the CIM operations. The output data DOUT4 are supplied as input data DIN6 of the memory macro 1106. The memory macro 1106 performs one or more CIM operations based on the input data DIN6 and one of the weight data W or inverted weight data WB stored in the memory macro 1106, and generates output data DOUT6 as results of the CIM operations. The output data DOUT6 are supplied as input data DIN8 of the memory macro 1108. The memory macro 1108 performs one or more CIM operations based on the input data DIN8 and one of the weight data W or inverted weight data WB stored in the memory macro 1108, and generates output data DOUT as results of the CIM operations.

One or more of the input data DIN, DIN4, DIN6, DIN8 correspond to the input data D_IN described with respect to FIG. 1, and/or one or more of the output data DOUT2, DOUT4, DOUT6, DOUT correspond to the output data D_OUT described with respect to FIG. 1, and similar detailed description is therefore omitted. In at least one embodiment, the described configuration of the memory macros 1102, 1104, 1106, 1108 implements a neural network. In at least one embodiment, one or more advantages described herein are achievable by the memory device 1100A.

Other configurations or quantities of elements in memory device 1100A are within the scope of the present disclosure.

Figure 11B:
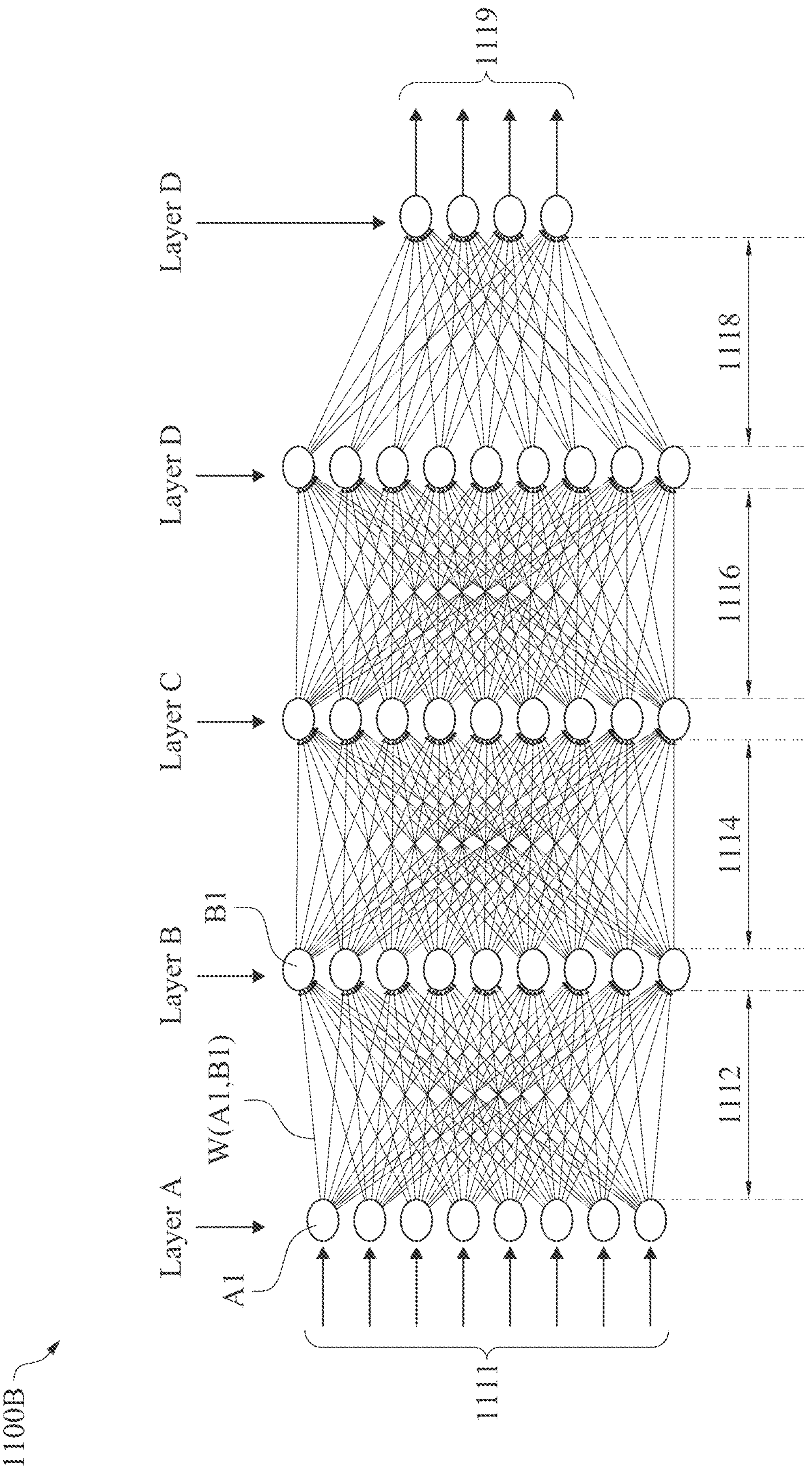
FIG. 11B is a schematic diagram of a neural network, in accordance with some embodiments.

FIG. 11B is a schematic diagram of a neural network 1100B, in accordance with some embodiments.

The neural network 1100B comprises a plurality of layers A-E each comprising a plurality of nodes (or neurons). The nodes in successive layers of the neural network 1100B are connected with each other by a matrix or array of connections. For example, the nodes in layers A and B are connected with each other by connections in a matrix 1112, the nodes in layers B and C are connected with each other by connections in a matrix 1114, the nodes in layers C and D are connected with each other by connections in a matrix 1116, and the nodes in layers D and E are connected with each other by connections in a matrix 1118. Layer A is an input layer configured to receive input data 1111. The input data 1111 propagate through the neural network 1100B, from one layer to the next layer via the corresponding matrix of connections between the layers. As the data propagate through the neural network 1100B, the data undergo one or more computations, and are output as output data 1119 from layer E which is an output layer of the neural network 1100B. Layers B, C, D between input layer A and output layer E are sometimes referred to as hidden or intermediate layers. The number of layers, number of matrices of connections, and number of nodes in each layer in FIG. 11B are examples. Other configurations are within the scopes of various embodiments. For example, in at least one embodiment, the neural network 1100B includes no hidden layer, and has an input layer connected by one matrix of connections to an output layer. In one or more embodiments, the neural network 1100B has one, two, or more than three hidden layers.

In some embodiments, the matrices 1112, 1114, 1116, 1118 are correspondingly implemented by the memory macros 1102, 1104, 1106, 1108, the input data 1111 corresponds to the input data DIN, and the output data 1119 corresponds to the output data DOUT, and similar detailed description is therefore omitted. Specifically, in the matrix 1112, a connection between a node in layer A and another node in layer B has a corresponding weight. For example, a connection between node A1 and node B1 has a weight W(A1,B1) which corresponds to a weight value or inverted weight value stored in the memory array of the memory macro 1102. The memory macros 1104, 1106, 1108 are configured in a similar manner. The weight data W or inverted weight data WB in one or more of the memory macros 1102, 1104, 1106, 1108 are updated, e.g., by a processor and through the memory controller 1120, as machine learning is performed using the neural network 1100B. One or more advantages described herein are achievable in the neural network 1100B implemented in whole or in part by one or more memory macros and/or memory devices in accordance with some embodiments.

Other configurations or quantities of elements in neural network 1100B are within the scope of the present disclosure.

Figure 11C:
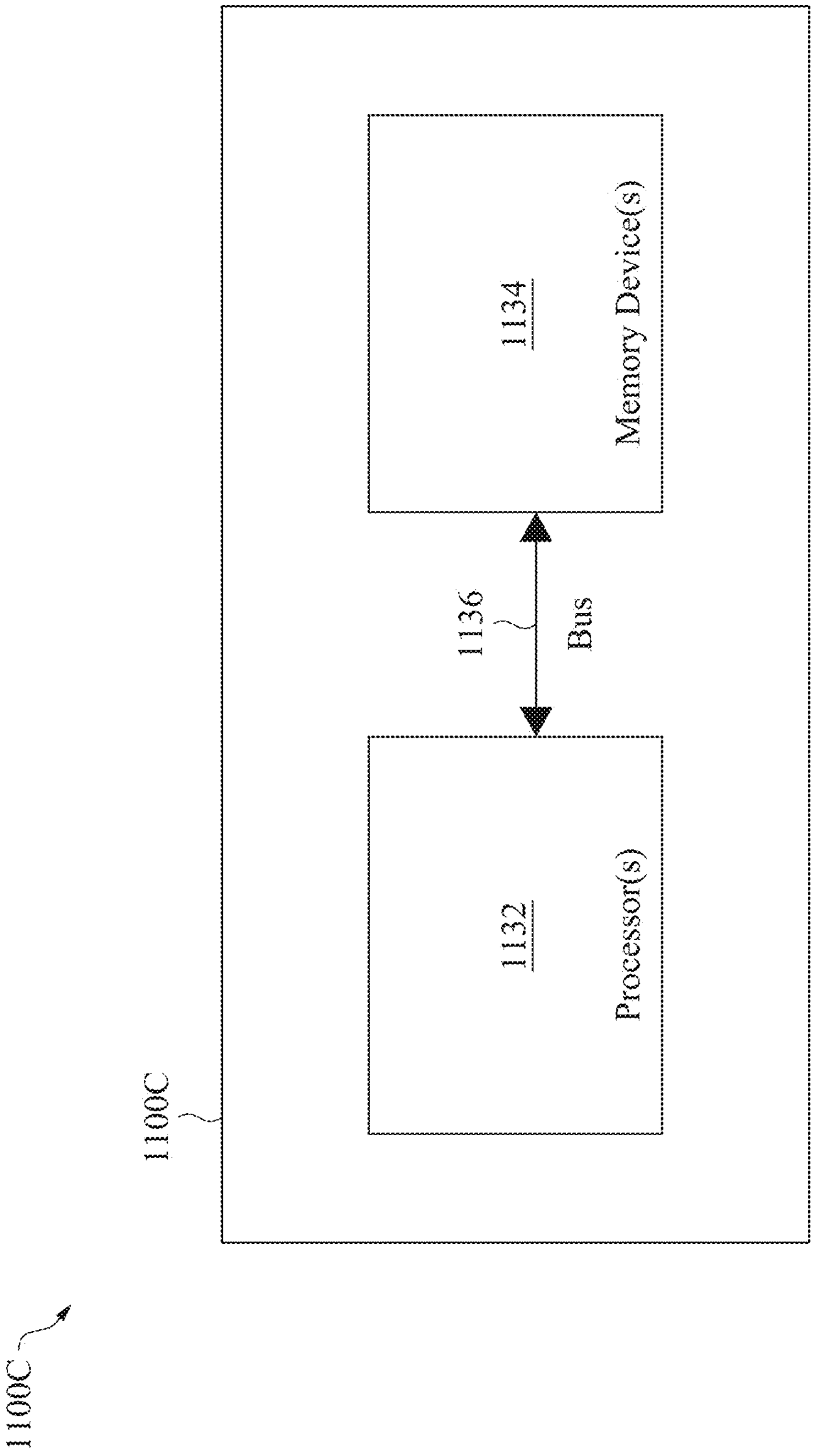
FIG. 11C is a schematic diagram of an integrated circuit (IC) device, in accordance with some embodiments.

FIG. 11C is a schematic diagram of an integrated circuit (IC) device 1100C, in accordance with some embodiments.

The IC device 1100C is an embodiment of memory device 100 of FIG. 1 or memory device 1100A of FIG. 11A, and similar detailed description is therefore omitted.

The IC device 1100C comprises one or more hardware processors 1132, one or more memory devices 1134 coupled to the processors 1132 by one or more buses 1136. In some embodiments, the one or more hardware processors 1132 is useable as one or more components in controller 120 of FIG. 1 or memory controller 1120 in FIG. 11A, and similar detailed description is therefore omitted. In some embodiments, the one or more memory devices 1134 is useable as one or more components in memory circuit 102 of FIG. 1, memory macro 110 of FIG. 1 or one or more of memory macros 1102, 1104, 1106 or 1108 in FIG. 11A, and similar detailed description is therefore omitted.

In some embodiments, the IC device 1100C comprises one or more further circuits including, but not limited to, cellular transceiver, global positioning system (GPS) receiver, network interface circuitry for one or more of Wi-Fi, USB, Bluetooth, or the like. Examples of the processors 1132 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 1134 include one or more memory devices and/or memory macros described herein. In at least one embodiment, each of the processors 1132 is coupled to a corresponding memory device among the memory devices 1134.

Because the one or more of the memory devices 1134 are CIM memory devices, various computations are performed in the memory devices which reduces the computing workload of the corresponding processor, reduces memory access time, and improves performance. In at least one embodiment, the IC device 1100C is a system-on-a-chip (SOC). In at least one embodiment, one or more advantages described herein are achievable by the IC device 1100C.

Other configurations or quantities of elements in IC device 1100C are within the scope of the present disclosure.

Figure 12A:
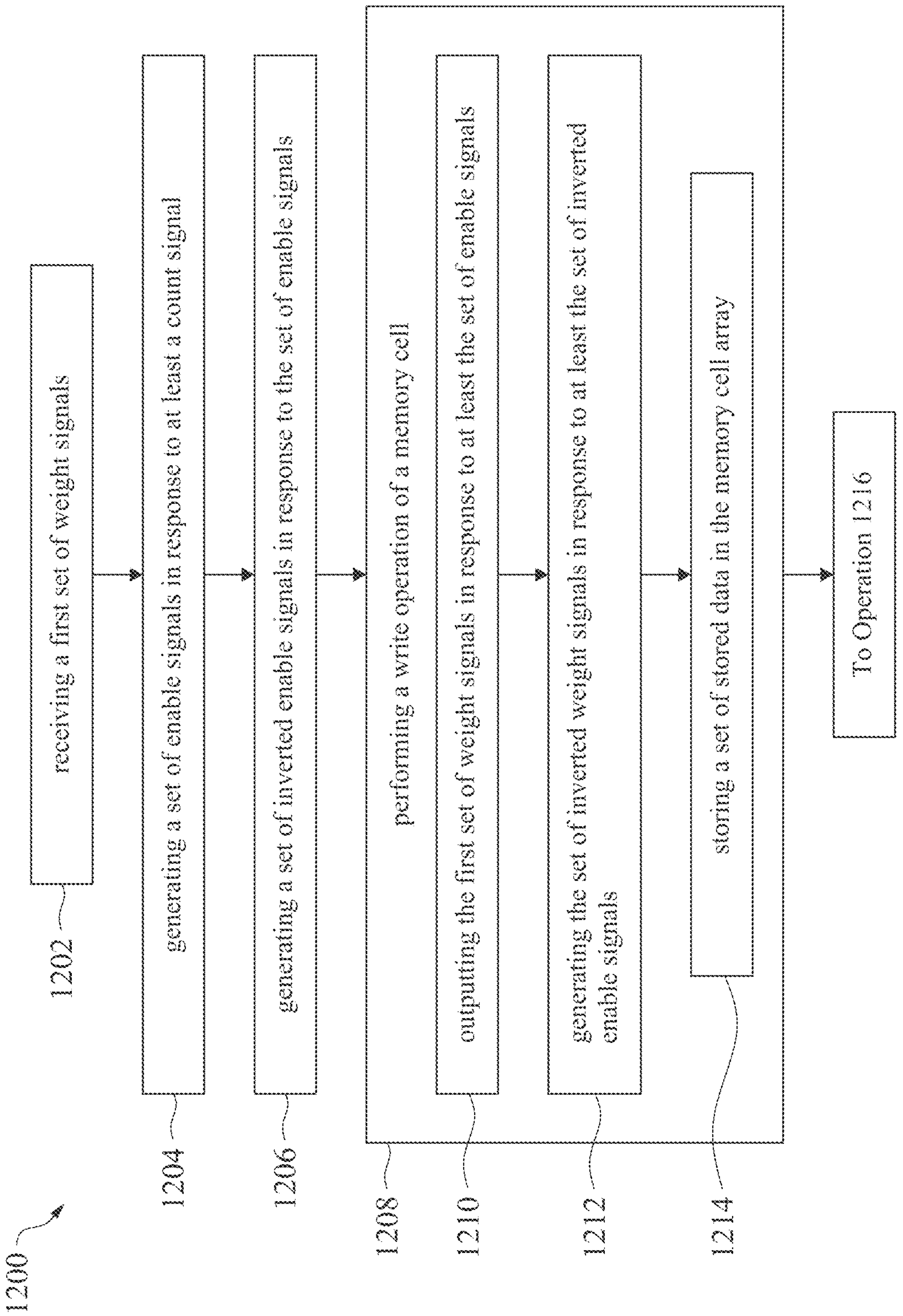
FIGS. 12A-12B are a flowchart of a method of operating a circuit, in accordance with some embodiments.
Figure 12B:
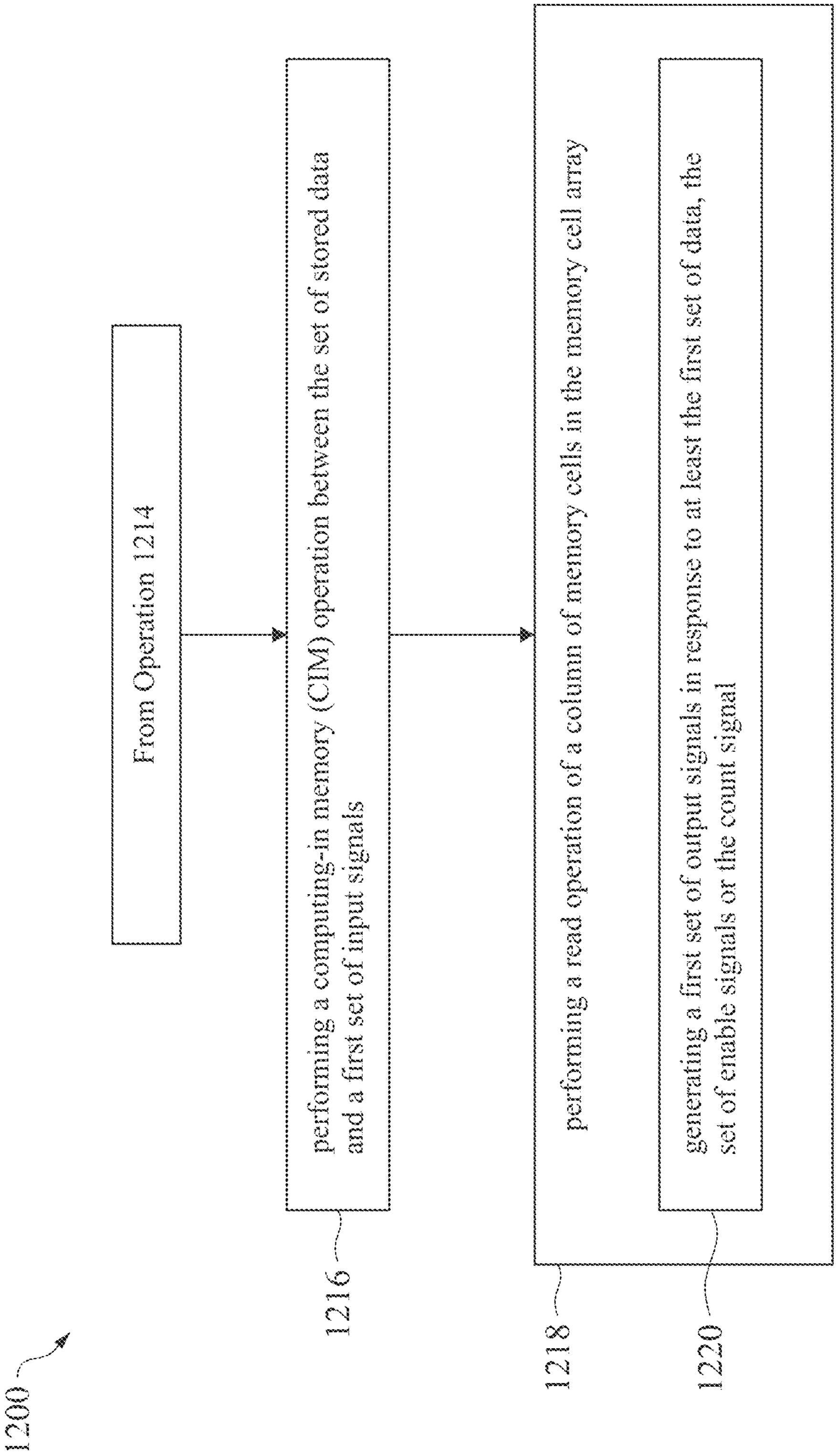

FIGS. 12A-12B are a flowchart of a method 1200 of operating a circuit, in accordance with some embodiments.

In some embodiments, FIGS. 12A-12B are a flowchart of method 1200 of operating a memory circuit, such as memory device 100 of FIG. 1, memory circuit 200 of FIG. 2, memory circuit 300 of FIG. 3, memory circuit 400 of FIG. 4, write circuit 500A-500B of corresponding FIGS. 5A-5B, circuit 600 of FIG. 6, memory circuit 700A-700B of corresponding FIGS. 7A-7B, write circuit 800 of FIG. 8, read circuit 900 of FIG. 9, memory device 1100A of FIG. 11A, neural network 1100B of FIG. 11B, IC device 1100C of FIG. 11C.

In some embodiments, method 1200 uses one or more aspects of waveforms 1000A-1000B of corresponding FIGS. 10A-10B.

It is understood that additional operations may be performed before, during, and/or after the method 1200 depicted in FIGS. 12A-12B, and that some other processes may only be briefly described herein. In some embodiments, other order of operations of method 1200 is within the scope of the present disclosure. Method 1200 include exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1200 is not performed.

In operation 1202 of method 1200, a first set of weight signals is received by a first write circuit.

In some embodiments, the first write circuit of method 1200 includes at least one of write circuit 406 or 500.

In some embodiments, the first set of weight signals of method 1200 includes the set of weight signals W.

In operation 1204 of method 1200, a set of enable signals INV_EN is generated in response to at least a count signal.

In some embodiments, the count signal of method 1200 includes the count signal ACT_XIN. In some embodiments, the count signal corresponds to a number of active word lines WL coupled to a memory cell array. In some embodiments, the memory cell array of method 1200 includes memory array 112.

In some embodiments, operation 1204 is performed by a second write circuit. In some embodiments, the second write circuit of method 1200 includes at least one of write circuit 402 or 800.

In operation 1206 of method 1200, a set of inverted enable signals INV_ENB is generated in response to the set of enable signals INV_EN.

In some embodiments, operation 1206 is performed by a first circuit. In some embodiments, the first circuit of method 1200 includes at least one of circuit 404 or 600.

In some embodiments, the set of inverted weight signals is inverted from the first set of weight signals.

In operation 1208 of method 1200, a write operation of the memory cell array is performed.

In some embodiments, operation 1208 includes at least one of operation 1210 or 1212.

In some embodiments, operation 1208 further includes operation 1214.

In operation 1210 of method 1200, the first set of weight signals is output in response to at least the set of enable signals INV_EN.

In some embodiments, operation 1210 is performed by the first write circuit.

In operation 1212 of method 1200, a set of inverted weight signals WB is output in response to at least the set of inverted enable signals INV_ENB.

In some embodiments, operation 1212 is performed by the first write circuit.

In operation 1214 of method 1200, a set of stored data is stored in the memory cell array.

In some embodiments, the set of stored data of method 1200 includes at least one of the first set of weight signals or the set of inverted weight signals WB. In some embodiments, the set of stored data of method 1200 includes one or more entries in at least one of the first set of weight signals or the set of inverted weight signals WB.

In some embodiments, operation 1214 is performed by the first write circuit.

In operation 1216 of method 1200, a computing-in memory (CIM) operation is performed between the set of stored data and a first set of input signals, thereby generating a first set of data.

In some embodiments, the first set of input signals of method 1200 includes the received data D_IN.

In some embodiments, operation 1216 is performed by a multiply-accumulate (MAC) circuit 115. In some embodiments, the MAC circuit is coupled to the memory cell array.

In some embodiments, operation 1216 of method 1200 is repeated for each column of memory cells in the memory cell array.

In some embodiments, the first set of data of method 1200 includes the set of output signals OUT or OUTB.

In operation 1218 of method 1200, a read operation of a column of memory cells in the memory cell array is performed.

In some embodiments, operation 1218 is performed by a read circuit. In some embodiments, the read circuit of method 1200 includes at least one of read circuit 408 or 900.

In some embodiments, the column of memory cells in the memory cell array includes one or more columns of memory cells in the memory cell array.

In some embodiments, operation 1218 of method 1200 is repeated for each column of memory cells in the memory cell array.

In some embodiments, operation 1218 includes operation 1220.

In operation 1220 of method 1200, a first set of output signals is generated in response to at least the first set of data, the set of enable signals INV_EN or the count signal.

In some embodiments, the first set of output signals of method 1200 includes the set of output signals D_OUT.

In some embodiments, operation 1220 is performed by a read circuit. In some embodiments, the read circuit of method 1200 includes at least one of read circuit 408 or 900.

In some embodiments, the read circuit is coupled to the MAC circuit and the memory cell array.

By using method 1200, the memory circuit operates to achieve one or more benefits discussed herein in the present disclosure.

While method 1200 was described above with reference to a single column of memory cells in memory array 112, it is understood that method 1200 applies to each column of memory device 100, in some embodiments.

Other operations of method 1200 are within the scope of the present disclosure.

Furthermore, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of elements in FIGS. 1-11C is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a memory cell array configured to store a set of stored data, the set of stored data being one of a first set of weight signals or a set of inverted weight signals, the set of inverted weight signals being inverted from the first set of weight signals. In some embodiments, the memory circuit further includes a multiply-accumulate (MAC) circuit coupled to the memory cell array, and configured to generate a first set of data in response to a second set of data and the set of stored data. In some embodiments, the memory circuit further includes an input output (IO) circuit coupled to the MAC circuit. In some embodiments, the IO circuit includes a first circuit coupled to the memory cell array, and configured to send the first set of weight signals in response to at least a set of enable signals, or generate the set of inverted weight signals in response to at least a set of inverted enable signals. In some embodiments, the IO circuit further includes a second circuit coupled to the MAC circuit, and configured to output a first set of output signals in response to at least the first set of data and the set of enable signals.

Another aspect of this description relates to a memory circuit. The memory circuit includes a compute-in-memory (CIM) macro circuit. In some embodiments, the CIM macro circuit includes a memory cell array including rows and columns, and configured to store a set of stored data, the set of stored data being one of a first set of weight signals or a set of inverted weight signals, the set of inverted weight signals being inverted from the first set of weight signals. In some embodiments, the CIM macro circuit further includes a multiply-accumulate (MAC) circuit coupled to the memory cell array, and configured to generate a first set of data in response to a second set of data and the set of stored data. In some embodiments, the memory circuit further includes an input output (IO) circuit coupled to the CIM macro circuit, and configured to output a first set of output signals. In some embodiments, the IO circuit includes a write circuit coupled to the memory cell array, and configured to send the first set of weight signals in response to at least a set of enable signals, or generate the set of inverted weight signals in response to at least a set of inverted enable signals. In some embodiments, the IO circuit further includes a read circuit coupled to the MAC circuit, and configured to output the first set of output signals in response to at least the first set of data and the set of enable signals.

Still another aspect of this description relates to a method of operating a memory circuit. The method includes receiving, by a first write circuit, a first set of weight signals. In some embodiments, the method further includes generating, by a second write circuit a set of enable signals in response to at least a count signal, the count signal corresponding to a number of active word lines coupled to a memory cell array. In some embodiments, the method further includes generating, by a first circuit a set of inverted enable signals in response to the set of enable signals, the set of inverted weight signals being inverted from the first set of weight signals. In some embodiments, the method further includes performing a write operation of the memory cell array. In some embodiments, the performing the write operation of the memory circuit includes at least one of outputting, by the first write circuit, the first set of weight signals in response to at least the set of enable signals, or generating, by the first write circuit, the set of inverted weight signals in response to at least the set of inverted enable signals. In some embodiments, the performing the write operation of the memory circuit further includes storing a set of stored data in the memory cell array, the set of stored data being one of the first set of weight signals or the set of inverted weight signals. In some embodiments, the method further includes performing, by a multiply-accumulate (MAC) circuit, a computing-in memory (CIM) operation between the set of stored data and a first set of input signals thereby generating a first set of data, the MAC circuit being coupled to the memory cell array. In some embodiments, the method further includes performing, by a read circuit, a read operation of a column of memory cells in the memory cell array.

In some embodiments, the performing the read operation of the column of memory cells in the memory cell array includes generating, by the read circuit coupled to the MAC circuit and the memory cell array, the first set of output signals in response to at least a first set of data, the set of enable signals or the count signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:

a memory cell array configured to store a set of stored data, the set of stored data being one of a first set of weight signals or a set of inverted weight signals, the set of inverted weight signals being inverted from the first set of weight signals;

a multiply-accumulate (MAC) circuit coupled to the memory cell array, and configured to generate a first set of data in response to a second set of data and the set of stored data; and an input output (IO) circuit coupled to the MAC circuit, the IO circuit comprising:

a first circuit coupled to the memory cell array, and configured to:

send the first set of weight signals in response to at least a set of enable signals; or generate the set of inverted weight signals in response to at least a set of inverted enable signals;

a second circuit coupled to the MAC circuit, and configured to output a first set of output signals in response to at least the first set of data and the set of enable signals;

a third circuit coupled to the first circuit and the second circuit, and configured to generate the set of enable signals in response to at least the set of stored data in the memory cell array; and a fourth circuit coupled to the first circuit and the third circuit, and configured to generate the set of inverted enable signals in response to the set of enable signals;

a set of word lines coupled to the memory cell array; and an input driver circuit coupled to the memory cell array by the set of word lines, and being configured to send a set of word line signals on the set of word lines, to generate a count signal, and to send the count signal to the IO circuit.

2. The memory circuit of claim 1, further comprising:

a weight buffer circuit coupled to the memory cell array and the first circuit, and configured to send the first set of weight signals to the memory cell array.

3. The memory circuit of claim 2, wherein the first circuit comprises:

a first set of paths, each path of the first set of paths comprising:

a first inverter coupled to the fourth circuit and the weight buffer circuit, and configured to generate a corresponding first inverted weight signal of the set of inverted weight signals in response to a corresponding first weight signal of a second set of weight signals and a corresponding first inverted enable signal of the set of inverted enable signals; and a second set of paths, each path of the second set of paths comprising:

a second inverter configured to generate a corresponding first intermediate weight signal of an intermediate set of inverted weight signals in response to the corresponding first weight signal of the second set of weight signals; and a third inverter coupled to the second inverter, the third circuit and the weight buffer circuit, and configured to generate a corresponding first weight signal of the first set of weight signals in response to the corresponding first intermediate weight signal of the intermediate set of inverted weight signals and a corresponding first enable signal of the set of inverted enable signals, wherein each path of the first set of paths and each corresponding path in the second set of paths are coupled together.

4. The memory circuit of claim 1, wherein the fourth circuit comprises:

a first set of inverters, each inverter of the first set of inverters is configured to generate a corresponding inverted signal of the set of inverted enable signals in response to a corresponding enable signal of the set of enable signals.

5. The memory circuit of claim 1, wherein the third circuit comprises:

an accumulator coupled to the first circuit and the fourth circuit, and configured to generate a set of accumulation signals in response to the set of stored data; and a comparator coupled to the accumulator, and configured to generate a set of output comparison signals in response to the set of accumulation signals and a first count signal, the set of output comparison signals being the set of enable signals, the first count signal corresponding to one half of a number of word lines coupled to the memory cell array.

6. The memory circuit of claim 1, wherein the second circuit comprises:

a set of analog-to-digital converters (ADC), each ADC of the set of ADCs is configured to generate a corresponding digital signal of a set of digital signals in response to a corresponding datum of the set of stored data; and a set of subtractors, each subtractor of the set of subtractors is configured to generate a corresponding output signal of the first set of output signals in response to at least a corresponding enable signal of the set of enable signals or the count signal on the set of word lines, wherein each ADC of the set of ADCs and each subtractor of the set of subtractors is coupled to a corresponding column of memory cells in the memory cell array.

7. The memory circuit of claim 1, wherein the input driver circuit comprises:

a set of input driver circuits, each input driver circuit of the set of input driver circuits is configured to generate a corresponding word line signal of the set of word line signals in response to a corresponding input signal of a set of input signals; and a counter coupled to the set of input driver circuits, and the counter being configured to count a number of inputs coupled to the set of input driver circuits thereby generating the count signal, and the counter being further configured to send the count signal to the IO circuit, the count signal being a number of the set of word lines.

8. A memory circuit, comprising:

a compute-in-memory (CIM) macro circuit, the CIM macro circuit comprising:

a memory cell array including rows and columns, and configured to store a set of stored data, the set of stored data being one of a first set of weight signals or a set of inverted weight signals, the set of inverted weight signals being inverted from the first set of weight signals; and a multiply-accumulate (MAC) circuit coupled to the memory cell array, and configured to generate a first set of data in response to a second set of data and the set of stored data; and an input output (IO) circuit coupled to the CIM macro circuit, and configured to output a first set of output signals, the IO circuit comprising:

a write circuit coupled to the memory cell array, and configured to:

send the first set of weight signals in response to at least a set of enable signals; or generate the set of inverted weight signals in response to at least a set of inverted enable signals;

a read circuit coupled to the MAC circuit, and configured to output the first set of output signals in response to at least the first set of data and the set of enable signals;

a first circuit coupled to the write circuit and the read circuit, and configured to generate the set of enable signals in response to at least the set of stored data in the memory cell array; and a second circuit coupled to the write circuit and the first circuit, and configured to generate the set of inverted enable signals in response to the set of enable signals;

a set of word lines coupled to the memory cell array; and an input driver circuit coupled to the memory cell array by the set of word lines, and being configured to send a set of word line signals on the set of word lines, to generate a count signal, and to send the count signal to the IO circuit.

9. The memory circuit of claim 8, wherein the second circuit comprises:

a first set of inverters, each inverter of the first set of inverters is configured to generate a corresponding inverted signal of the set of inverted enable signals in response to a corresponding enable signal of the set of enable signals.

10. The memory circuit of claim 8, wherein the first circuit comprises:

an accumulator coupled to the write circuit and the second circuit, and configured to generate a set of accumulation signals in response to the set of stored data; and a comparator coupled to the accumulator, and configured to generate a set of output comparison signals in response to the set of accumulation signals and a first count signal, the set of output comparison signals being the set of enable signals, the first count signal corresponding to one half of a number of word lines coupled to the memory cell array.

11. The memory circuit of claim 8, wherein the read circuit comprises:

a set of analog-to-digital converters (ADC), each ADC of the set of ADCs is configured to generate a corresponding digital signal of a set of digital signals in response to a corresponding datum of the set of stored data; and a set of subtractors, each subtractor of the set of subtractors is configured to generate a corresponding output signal of the first set of output signals in response to at least a corresponding enable signal of the set of enable signals or a first count signal on the set of word lines, wherein each ADC of the set of ADCs and each subtractor of the set of subtractors is coupled to a corresponding column of memory cells in the memory cell array.

12. The memory circuit of claim 8, wherein the input driver circuit comprises:

a set of input driver circuits, each input driver circuit of the set of input driver circuits is configured to generate a corresponding word line signal of the set of word line signals in response to a corresponding input signal of a set of input signals; and a counter coupled to the set of input driver circuits, and the counter being configured to count a number of inputs coupled to the set of input driver circuits thereby generating the count signal, and the counter being further configured to send the count signal to the IO circuit, the count signal being a number of the set of word lines.

13. The memory circuit of claim 8, wherein the write circuit comprises:

a first set of paths, each path of the first set of paths comprising:

a first inverter coupled to the second circuit, and configured to generate a corresponding first inverted weight signal of the set of inverted weight signals in response to a corresponding first weight signal of a second set of weight signals and a corresponding first inverted enable signal of the set of inverted enable signals; and a second set of paths, each path of the second set of paths comprising:

a second inverter configured to generate a corresponding first intermediate weight signal of an intermediate set of inverted weight signals in response to the corresponding first weight signal of the second set of weight signals; and a third inverter coupled to the second inverter and the first circuit, and configured to generate a corresponding first weight signal of the first set of weight signals in response to the corresponding first intermediate weight signal of the intermediate set of inverted weight signals and a corresponding first enable signal of the set of inverted enable signals, wherein each path of the first set of paths and each corresponding path in the second set of paths are coupled together.

14. A method of operating a memory circuit, the method comprising:

receiving, by a first write circuit, a first set of weight signals;

generating, by a second write circuit, a set of enable signals in response to at least a count signal, the count signal corresponding to a number of active word lines coupled to a memory cell array;

generating, by a first circuit, a set of inverted enable signals in response to the set of enable signals, a set of inverted weight signals being inverted from the first set of weight signals;

performing a write operation of the memory cell array, the performing the write operation of the memory cell array comprising:
at least one of:
outputting, by the first write circuit, the first set of weight signals in response to at least the set of enable signals; or
generating, by the first write circuit, the set of inverted weight signals in response to at least the set of inverted enable signals; and
storing a set of stored data in the memory cell array, the set of stored data being one of the first set of weight signals or the set of inverted weight signals;
performing, by a multiply-accumulate (MAC) circuit, a computing-in memory (CIM) operation between the set of stored data and a first set of input signals thereby generating a first set of data, the MAC circuit being coupled to the memory cell array;
performing, by a read circuit, a read operation of a column of memory cells in the memory cell array, the performing the read operation of the column of memory cells in the memory cell array comprises:
generating, by the read circuit coupled to the MAC circuit and the memory cell array, the first set of output signals in response to at least a first set of data, the set of enable signals or the count signal.

15. The memory circuit of claim 8, further comprising:
a weight buffer circuit coupled to the memory cell array and the write circuit, and configured to send the first set of weight signals to the memory cell array.

16. The memory circuit of claim 8, further comprising:
a bit line driver circuit coupled to the memory cell array by a set of bit lines.

17. The memory circuit of claim 16, further comprising:
a bit line bar driver circuit coupled to the memory cell array by a set of bit line bars.

18. The memory circuit of claim 1, further comprising:
a bit line driver circuit coupled to the memory cell array by a set of bit lines.

19. The memory circuit of claim 18, further comprising:
a bit line bar driver circuit coupled to the memory cell array by a set of bit line bars.

20. The memory circuit of claim 1, wherein the memory cell array comprises a static random-access memory (SRAM) cell array.

* * * * *